US009478608B2

(12) United States Patent
Salcedo et al.

(10) Patent No.: US 9,478,608 B2
(45) Date of Patent: Oct. 25, 2016

(54) APPARATUS AND METHODS FOR TRANSCEIVER INTERFACE OVERVOLTAGE CLAMPING

(71) Applicant: Analog Devices, Inc., Norwood, MA (US)

(72) Inventors: Javier Alejandro Salcedo, North Billerica, MA (US); James Zhao, San Francisco, CA (US); Juan Luo, San Jose, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 56 days.

(21) Appl. No.: 14/546,703

(22) Filed: Nov. 18, 2014

(65) Prior Publication Data
US 2016/0141358 A1 May 19, 2016

(51) Int. Cl.
*H01L 27/02* (2006.01)
*H01L 23/62* (2006.01)
(Continued)

(52) U.S. Cl.
CPC ......... *H01L 29/0646* (2013.01); *H01L 21/761* (2013.01); *H01L 23/62* (2013.01); *H01L 27/0248* (2013.01); *H01L 27/0259* (2013.01); *H01L 27/0262* (2013.01); *H01L 27/0292* (2013.01)

(58) Field of Classification Search
CPC ........... H01L 27/0248; H01L 27/0292; H01L 27/0259; H01L 27/0262; H01L 23/62
See application file for complete search history.

(56) References Cited

U.S. PATENT DOCUMENTS

| | | | |
|---|---|---|---|
| 3,436,667 A | 4/1969 | Kedson | |
| 4,331,884 A * | 5/1982 | Svedberg | H01L 27/0248 257/174 |
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |
| 5,343,053 A | 8/1994 | Avery | |
| 5,541,801 A | 7/1996 | Lee et al. | |
| 5,576,557 A | 11/1996 | Ker et al. | |

FOREIGN PATENT DOCUMENTS

| | | |
|---|---|---|
| DE | 10 2007 040 875 A1 | 3/2009 |
| EP | 0 168 678 A2 | 1/1986 |

(Continued)

OTHER PUBLICATIONS

Petr Betak: "An Advanced SCR Protective Structure Against ESD Stress". Proceedings of the 13th Conference Student EEICT 2007, vol. 4, Jan. 2007, pp. 286-290.

(Continued)

*Primary Examiner* — Thanhha Pham
(74) *Attorney, Agent, or Firm* — Knobbe Martens Olson & Bear LLP

(57) ABSTRACT

Apparatus and methods for transceiver interface overvoltage clamping are provided. In certain configurations, an interface device includes a first p-type well region and a second p-type well region in an n-type isolation structure. Additionally, the clamp device includes a first p-type active region and a first n-type active region in the first p-type well region and electrically connected to a first terminal of the clamp device. Furthermore, the clamp device includes a second p-type active region and a second n-type active region in the second p-type well region and electrically connected to a second terminal of the clamp device. The n-type isolation structure is in a p-type region of a semiconductor substrate, and electrically isolates the first and second p-type well regions from the p-type substrate region. The clamp device further includes a blocking voltage tuning structure positioned between the first and second n-type active regions.

35 Claims, 32 Drawing Sheets

(51) Int. Cl.
  *H01L 29/06* (2006.01)
  *H01L 21/761* (2006.01)

(56) References Cited

U.S. PATENT DOCUMENTS

| | | | |
|---|---|---|---|
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 | 8/2004 | Menegoli |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,890,248 B2 | 11/2014 | Pauletti et al. |
| 8,946,822 B2 | 2/2015 | Salcedo et al. |
| 8,947,841 B2 | 2/2015 | Salcedo et al. |
| 8,963,200 B2 | 2/2015 | Lee et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0199874 A1 | 8/2012 | Salcedo et al. |
| 2012/0205714 A1 | 8/2012 | Salcedo et al. |
| 2012/0211869 A1 | 8/2012 | Lee et al. |
| 2012/0293904 A1 | 11/2012 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |

FOREIGN PATENT DOCUMENTS

| | | |
|---|---|---|
| EP | 0 915 508 A1 | 5/1999 |
| EP | 1 703 560 A2 | 9/2006 |

(56) References Cited

FOREIGN PATENT DOCUMENTS

| KR | 10-2006-0067100 | 2/2006 |
|---|---|---|
| KR | 10-2009-0123683 | 12/2009 |
| KR | 10-2010-0003569 | 1/2010 |

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Chang et al., *High-k Metal Gate-bounded Silicon Controlled Rectifier for ESD Protection*, 34th Electrical Overstress/Electrostatic Discharge Symposium, Sep. 2012, 7 pages.

Salcedo et al., *On-Chip Protection for Automotive Integrated Circuits Robustness*, 2012 8th International Caribbean Conference on Devices, Circuits and Systems (ICCDCS), 5 pages, Mar. 2012.

\* cited by examiner

APPARATUS AND METHODS FOR TRANSCEIVER INTERFACE OVERVOLTAGE CLAMPING

BACKGROUND

1. Field

Embodiments of the invention relate to electronic systems, and more particularly, to dual-polarity overvoltage clamp devices for integrated circuits (ICs).

2. Description of the Related Technology

Certain electronic systems can be exposed to a transient electrical event, or an electrical signal of a relatively short duration having rapidly changing voltage and high power. Transient electrical events can include, for example, electrostatic discharge (ESD) events and/or electromagnetic interference (EMI) events.

Transient electrical events can damage integrated circuits (ICs) inside an electronic system due to overvoltage conditions and/or high levels of power dissipation over relatively small areas of the ICs. High power dissipation can increase IC temperature, and can lead to numerous irreversible problems, such as gate oxide breakdown, junction damage, metal damage, and surface charge trapping. Moreover, transient electrical events can induce latch-up (in other words, inadvertent creation of a regenerative low-impedance path), thereby disrupting the functioning of the IC and/or potentially causing permanent damage to the IC. Thus, there is a need for low power consumption devices capable of providing an IC with high levels of reliability even when operating in harsh conditions, such as high temperature and electrically noisy environments, to allow precision signal processing for wide dual-polarity signal swings.

SUMMARY

In one aspect, an apparatus is provided. The apparatus includes an n-type isolation structure in a p-type region of a substrate, a first p-type well region in the n-type isolation structure, and a second p-type well region in the n-type isolation structure and spaced apart from the first p-type well region. The n-type isolation structure electrically isolates the first and second p-type well regions from the p-type region of the substrate. The apparatus further includes a first p-type active region and a first n-type active region in the first p-type well region, and a second p-type active region and a second n-type active region in the second p-type well region. The first n-type active region and the first p-type active region are electrically connected to a first terminal, and the second n-type active region and the second p-type active region are electrically connected to a second terminal. The apparatus further includes a blocking voltage tuning structure positioned between the first and second n-type active regions.

In another aspect, an apparatus is provided. The apparatus includes an n-type isolation structure in a p-type region of a substrate, a first p-type well region in the n-type isolation structure, and a second p-type well region in the n-type isolation structure and spaced apart from the first p-type well region. The n-type isolation structure electrically isolates the first and second p-type well regions from the p-type region of the substrate. The apparatus further includes a first p-type active region and a first n-type active region in the first p-type well region, and a second p-type active region and a second n-type active region in the second p-type well region. The first n-type active region and the first p-type active region are electrically connected to a first terminal, and the second n-type active region and the second p-type active region are electrically connected to a second terminal. The apparatus further includes a means for blocking voltage tuning positioned between the first and second n-type active regions.

In another aspect, a method of forming a clamp device is provided. The method includes forming an n-type isolation structure in a p-type region of a substrate, forming a first p-type well region in the n-type isolation structure, and forming a second p-type well region in the n-type isolation structure and spaced apart from the first p-type well region. The n-type isolation structure electrically isolates the first and second p-type well regions from the p-type region of the substrate. The method further includes forming a first p-type active region and a first n-type active region in the first p-type well region, forming a second p-type active region and a second n-type active region in the second p-type well region, and forming a blocking voltage tuning structure between the first and second n-type active regions.

In another aspect, a transceiver interface is provided. The transceiver interface includes a first pin and a first clamp device having a first terminal electrically connected to the first pin and a second terminal electrically connected to a first voltage. The first clamp device includes an n-type isolation structure in a p-type region of a substrate, a first p-type well region in the n-type isolation structure, and a second p-type well region in the n-type isolation structure and spaced apart from the first p-type well region. The n-type isolation structure electrically isolates the first and second p-type well regions from the p-type region of the substrate. The first clamp device further includes a first p-type active region and a first n-type active region in the first p-type well region, and a second p-type active region and a second n-type active region in the second p-type well region. The first n-type active region and the first p-type active region are electrically connected to the first terminal, and the second n-type active region and the second p-type active region are electrically connected to the second terminal. The first clamp device further includes a blocking voltage tuning structure positioned between the first and second n-type active regions.

DETAILED DESCRIPTION OF EMBODIMENTS

Figure 1:
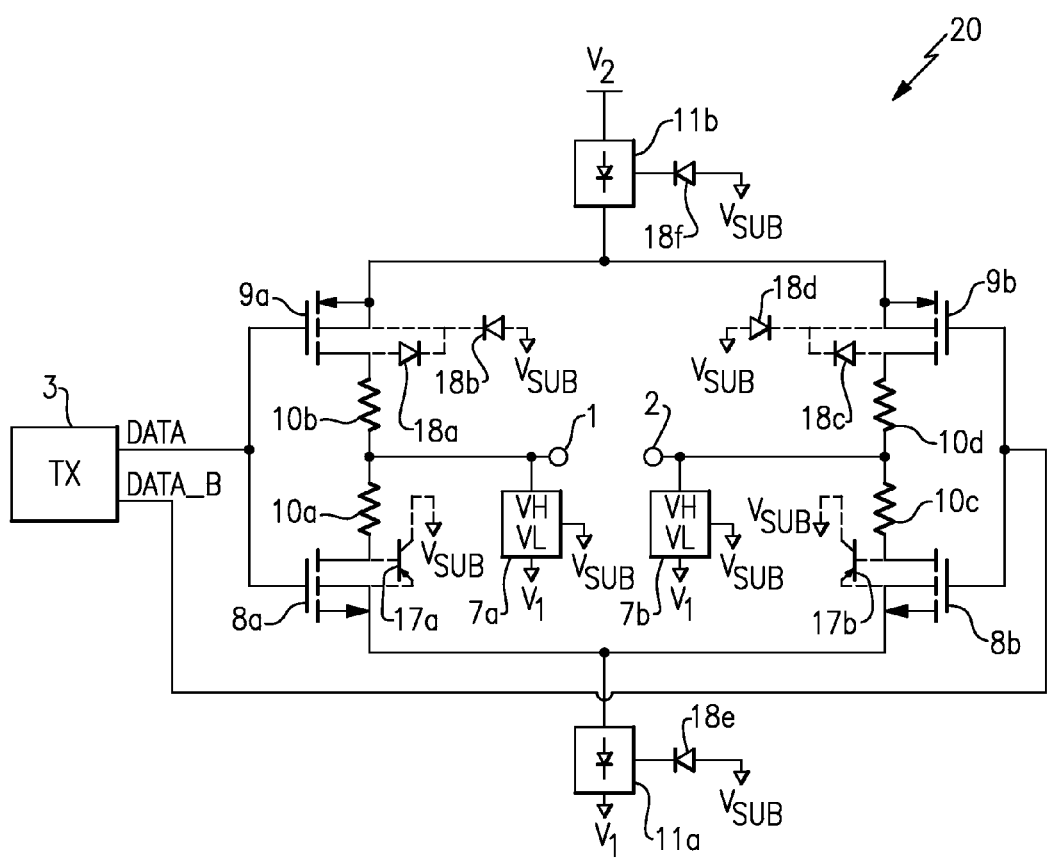
FIG. 1 shows a circuit diagram of one example of a transceiver interface.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of transient electrical events as discussed above, including electrostatic discharge (ESD) events and/or electromagnetic interference (EMI) events.

Apparatus and dual-polarity overvoltage clamp devices are provided herein. The clamp devices can be used, for example, to protect transceiver interface inputs and/or outputs, signal amplifier inputs and/or outputs, and/or data converters inputs and/or outputs.

In certain configurations, a dual-polarity overvoltage clamp device includes a first p-type well region and a second p-type well region in an n-type isolation structure. Additionally, the clamp device includes a first p-type active region and a first n-type active region in the first p-type well region and electrically connected to a first terminal of the clamp device. Furthermore, the clamp device includes a second p-type active region and a second n-type active region in the second p-type well region and electrically connected to a second terminal of the clamp device. The n-type isolation structure is in a p-type region of a semiconductor substrate, and electrically isolates the first and second p-type well regions from the p-type substrate region. The semiconductor substrate can be implemented in a variety of ways, including, but not limited to, a doped semiconductor substrate or a silicon on insulator (SOI) substrate including a silicon-insulator-silicon structure such that the p-type well regions are isolated from a support substrate using an insulator layer.

The clamp device further includes a blocking voltage tuning structure positioned between the first and second n-type active regions. The blocking voltage tuning structure is implemented to provide a desired protection response between the dual-polarity overvoltage clamp device's terminals, thereby achieving a desired voltage range or signal swing in which the dual-polarity overvoltage clamp device operates with high impedance to block current conduction. In particular, the blocking voltage tuning structure can be implemented to achieve a desired maximum forward voltage between the first and second terminals in which the overvoltage clamp device provides high impedance as well as a maximum reverse voltage between the first and second terminals in which the overvoltage clamp device provides high impedance. When the voltage difference between the first and second terminals is greater than the forward blocking voltage or less than the reverse blocking voltage, the dual-polarity overvoltage clamp device can operate in a low impedance/high current conduction state. Thus, the blocking voltage tuning structure can be used to control the overvoltage clamp device's desired forward trigger voltage, forward holding voltage, reverse trigger voltage, and/or reverse holding voltage.

As will be described in detail herein, the blocking voltage tuning structure can achieve desired maximum forward and reverse voltages between the first and second terminals by, for example, selection of the size, spacing, and/or doping concentrations of active regions and wells associated with blocking junctions in the blocking voltage tuning structure. Thus, a forward and reverse dual-polarity overvoltage clamp characteristic desired for a particular application can be achieved.

The clamp devices herein can exhibit high substrate isolation by design. For example, the clamp devices can have a high breakdown voltage between the substrate and the clamp device's first and second terminals. Thus, the clamp device can exhibit wider isolation margin and/or increased robustness against latch-up.

The clamp devices herein can be used to protect parasitic substrate devices from damage during ESD and/or EMI conditions. The clamp devices can be used in a variety of applications, including local interconnect network (LIN) interfaces, controller area network (CAN) interfaces, FlexRay interfaces, RS-232 interfaces, RS-485 interfaces, single edge nibble transmission (SENT) interfaces, and/or Automotive Audio BUS (ATB) interfaces.

FIG. 1 shows a circuit diagram of one example of a transceiver interface 20, which can include one or more dual-polarity overvoltage clamp devices described herein. The transceiver interface 20 includes a first pin 1, a second pin 2, a transmitter circuit 3, a first clamp device 7a, a second clamp device 7b, a first n-type metal oxide semiconductor (NMOS) transistor 8a, a second NMOS transistor 8b, a p-type metal oxide semiconductor (PMOS) transistor 9a, a second PMOS transistor 9b, a first resistor 10a, a second resistor 10b, a third resistor 10c, a fourth resistor 10d, a first diode structure 11a, and a second diode structure 11b.

As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The transceiver interface 20 can be, for example, an interface IC, such as a half or full duplex communication transceiver IC in which the first and second pins 1, 2 are directly exposed to a user, for instance, connected to car cables or an industrial machinery hardness, in a normal operational environment. The transceiver interface 20 can be used to communicate data over the interface, such as by using low voltage differential signaling. For clarity of the figures, details related to receiving signals over the first and second pins 1, 2 have been omitted from FIG. 1.

The NMOS transistors 8a, 8b and PMOS transistors 9a, 9b can be used for electrically transmitting signals over the first and second pins 1, 2. For example, the transmitter circuit 3 can be used to control the gate voltages of the NMOS transistors 8a, 8b and PMOS transistors 9a, 9b to control a differential voltage between the first and second pins 1, 2. The voltage can have positive or negative polarity.

As shown in FIG. 1, the transceiver interface 20 can receive power from a power high supply voltage $V_2$ and a power low supply voltage $V_1$. Certain components of the transceiver interface 20, such as the NMOS transistors 8a, 8b, PMOS transistors 9a, 9b, diode structures 11a, 11b, and clamp devices 7a, 7b can be fabricated in a substrate that is biased using a substrate voltage $V_{SUB}$.

Various parasitic substrate devices can be present in the transceiver interface 20. The parasitic substrate devices can include terminals electrically connected to the substrate voltage $V_{SUB}$. Absent protection, the parasitic substrate devices may be damaged during ESD and/or EMI conditions.

In the illustrated configuration, the NMOS transistors 8a, 8b include parasitic substrate bipolar transistors 17a, 17b, respectively. Additionally, the PMOS transistors 9a, 9b include parasitic substrate diodes 18a-18d. Furthermore, the diode structures 11a, 11b include parasitic substrate diodes 18e, 18f, respectively. Although a certain parasitic substrate devices are shown in FIG. 1, other configurations of parasitic substrate devices are possible.

The first clamp device 7a includes a first terminal VH electrically connected to the first pin 1, a second terminal VL electrically connected to the power low voltage $V_1$, and a substrate terminal electrically connected to the substrate voltage $V_{SUB}$. Additionally, the second clamp device 7b includes a first terminal VH electrically connected to the second pin 2, a second terminal VL electrically connected to the power low voltage $V_1$, and a substrate terminal electrically connected to the substrate voltage $V_{SUB}$. The first and second clamp devices 7a, 7b can be used to protect the transceiver interface 20 from ESD and/or EMI events. The clamp devices 7a, 7b can protect components of the transceiver interface 20 including, for example, parasitic substrate devices associated with the components.

The transceiver interface 20 of FIG. 1 illustrates one example of a transceiver interface that can be implemented using the dual-polarity overvoltage clamp devices described herein. However, the transceiver interfaces can be implemented in other ways to meet communication protocol constraints.

Additionally, although the clamp devices have been illustrated in the context of transceiver interfaces, the clamp devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems. Additionally, although the transceiver interface 20 has been illustrated as including two signal pins and two clamp devices, more or fewer clamp devices and pins can be included to meet system specifications. Furthermore, the clamp devices can be connected in other ways. For example, the terminals of the clamp devices can be connected in other ways, such as to other nodes and/or voltages.

Figure 2:
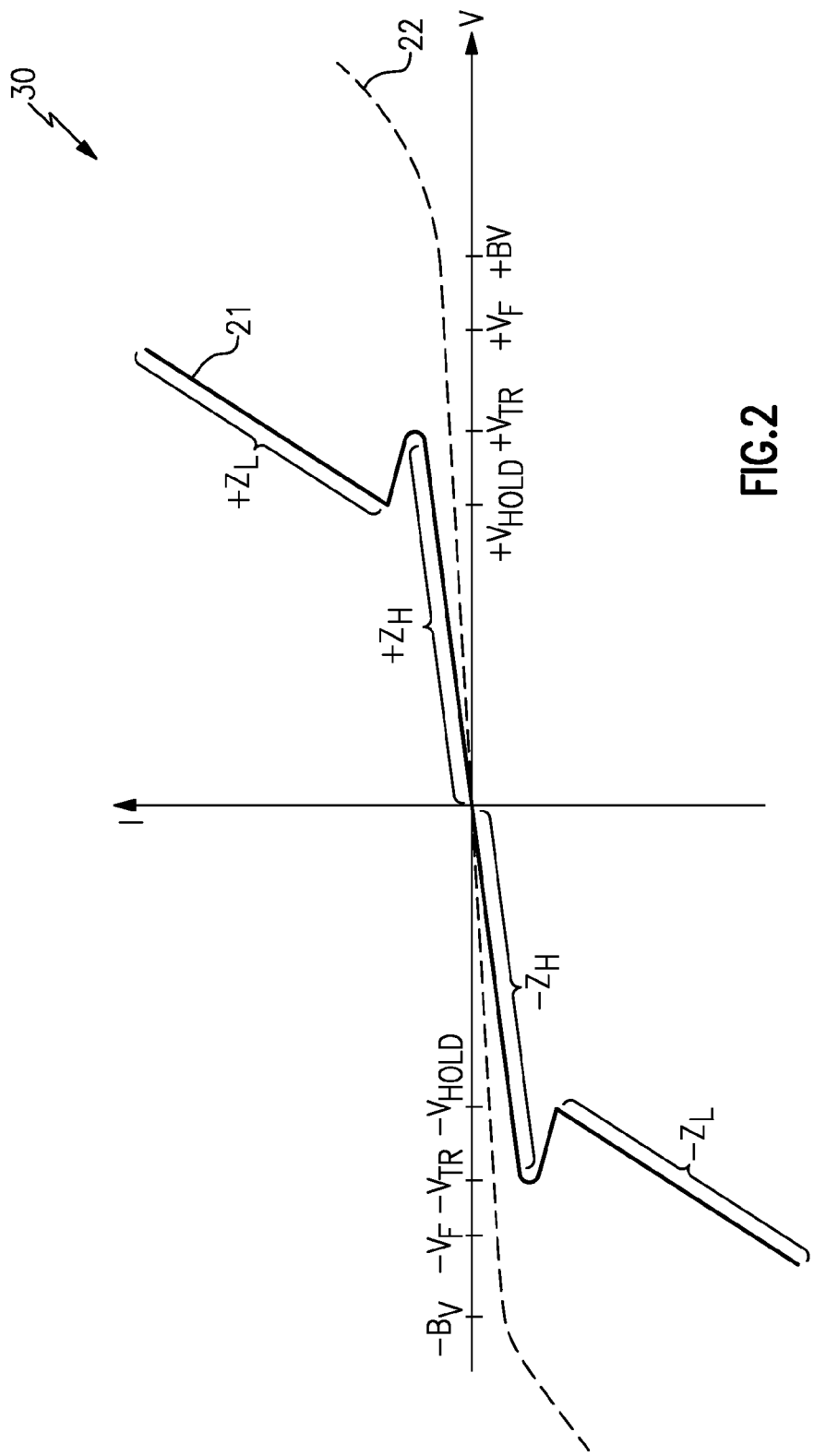
FIG. 2 is a graph showing a relationship between current and voltage of a dual-polarity overvoltage clamp device according to one embodiment.

FIG. 2 is a graph 30 showing a relationship between current and voltage of a clamp device according to one embodiment. As described above, a clamp device can include a first terminal VH, a second terminal VL, and a substrate terminal.

The graph 30 includes a first plot 21 corresponding to one example of a clamp device current versus voltage (I-V) relationship when the voltage of the first terminal VH is varied while the voltages of the second terminal VL and the substrate terminal are independent and held constant. Additionally, the graph 30 includes a second plot 22 corresponding to one example of a dual-polarity overvoltage clamp device response when the voltage of the substrate terminal is varied while the voltage of the first terminal VH and the second terminal VL are held constant.

As shown in FIG. 2, the clamp device can transition from a high-impedance state $+Z_H$ to a low-impedance state $+Z_L$ when the voltage difference between the first terminal VH and the second terminal VL reaches a positive trigger voltage $+V_{TR}$. Thereafter, the clamp device can shunt a large amount of current and remain in the low-impedance state $+Z_L$ as long as the voltage difference between the first terminal VH and the second terminal VL remains above a positive holding voltage $+V_{HOLD}$. By configuring the clamp device to have both a trigger voltage and a holding voltage, the clamp device can exhibit enhanced stability against unintended activation.

The clamp device can also transition from a high-impedance state $-Z_H$ to a low-impedance state $-Z_L$ when the voltage difference between the first terminal VH and the second terminal VL reaches a negative trigger voltage $-V_{TR}$. The clamp device can remain in the low-impedance state $-Z_L$ as long as the voltage difference between the first terminal VH and the second terminal VL remains below the negative holding voltage $-V_{HOLD}$. Bidirectional operation of the dual-polarity overvoltage clamp device can permit a reduction in layout area relative to a design that uses separate structures for protection against positive and negative transient electrical events, thereby enabling a more scalable design solution.

As shown in FIG. 2, the clamp device can be configured to transition to a low-impedance state before the voltage difference between the first terminal VH and the second terminal VL reaches either a positive failure voltage $+V_F$ or a negative failure voltage $-V_F$ that can otherwise cause damage to the IC.

When normal operating voltages are applied to the terminals of the clamp device, the clamp device should conduct a relatively small leakage current, thereby reducing or minimizing static power dissipation and enhancing the energy efficiency of the IC. Thus, the clamp device can be configured to be very low leakage at normal operating voltages and to trigger during transient electrical events before internal or core devices reach overvoltage conditions.

As shown by the second plot 22, the clamp device can be highly isolated from voltage changes to the substrate terminal. For example, in the illustrated example, a positive substrate breakdown voltage +BV to the substrate terminal can be greater than the positive trigger voltage +$V_{TR}$, and a negative substrate breakdown voltage −BV to the substrate terminal can be beyond the negative trigger voltage −$V_{TR}$.

In certain implementations described herein, a clamp device is implemented to have a forward trigger voltage +$V_{TR}$ in the range of 3 V to 80 V, a forward holding voltage +$V_{HOLD}$ in the range of 2 V to 60 V, a reverse trigger voltage −$V_{TR}$ in the range of −3 V to −80 V, a reverse holding voltage −$V_{HOLD}$ in the range of −2 V to −60 V, a forward substrate breakdown voltage +BV in the range of 15 V to 100 V, and a revere substrate breakdown voltage −BV in the range of −3 V to −80 V. However, other implementations are possible.

In FIG. 2, voltage is expressed along a horizontal axis, and current is expressed along a vertical axis. In the illustrated embodiment, the clamp device has I-V characteristics that are symmetrical. In other implementations, the clamp devices described herein can have asymmetrical I-V characteristics. For example, clamp devices can have different trigger voltages, holding voltages, and/or failure voltages with different I-V curves in the positive and negative regions of the graph.

Figure 3A:
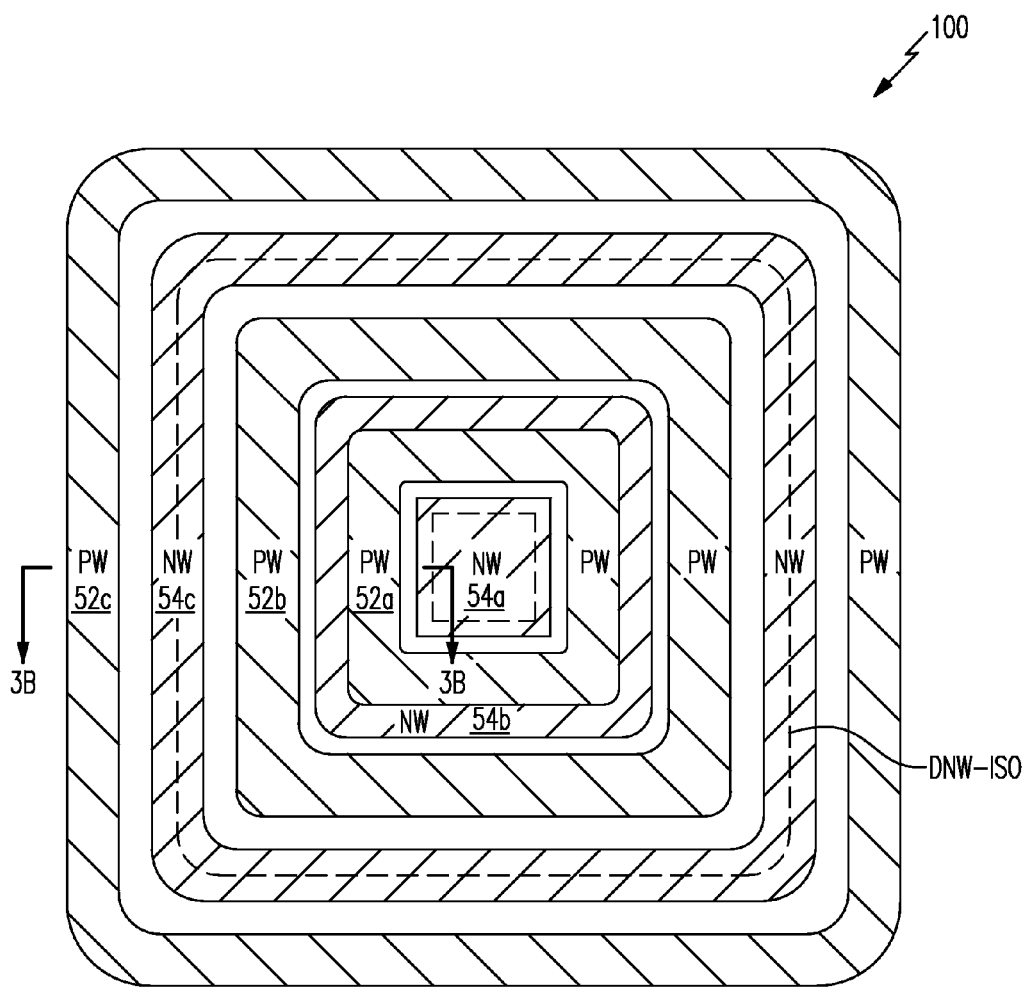
FIG. 3A is a top plan view of a dual-polarity overvoltage clamp device according to one embodiment.
Figure 3B:
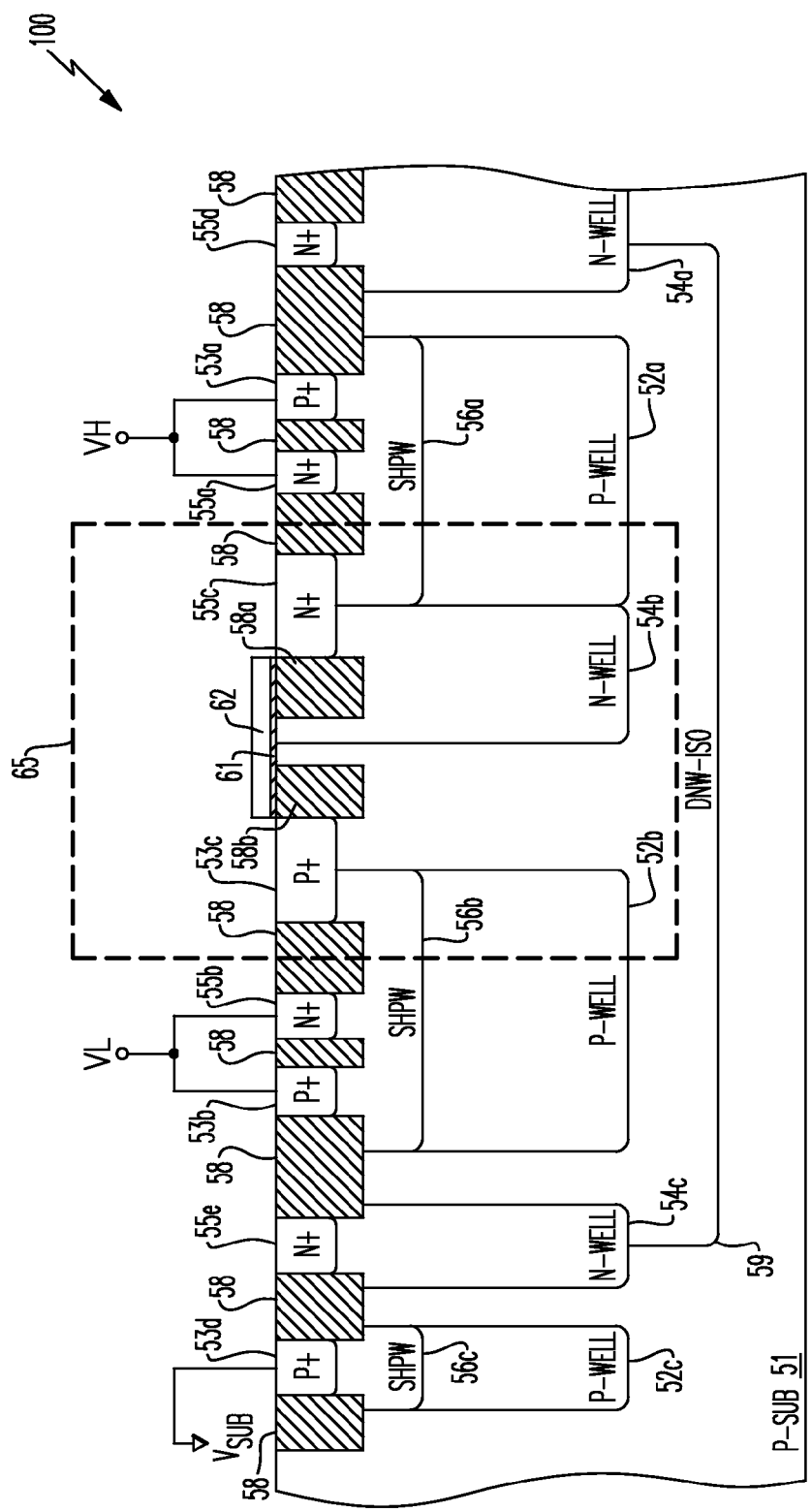
FIG. 3B is a cross-section of the dual-polarity overvoltage clamp device of FIG. 3A taken along the lines 3B-3B.
Figure 3C:
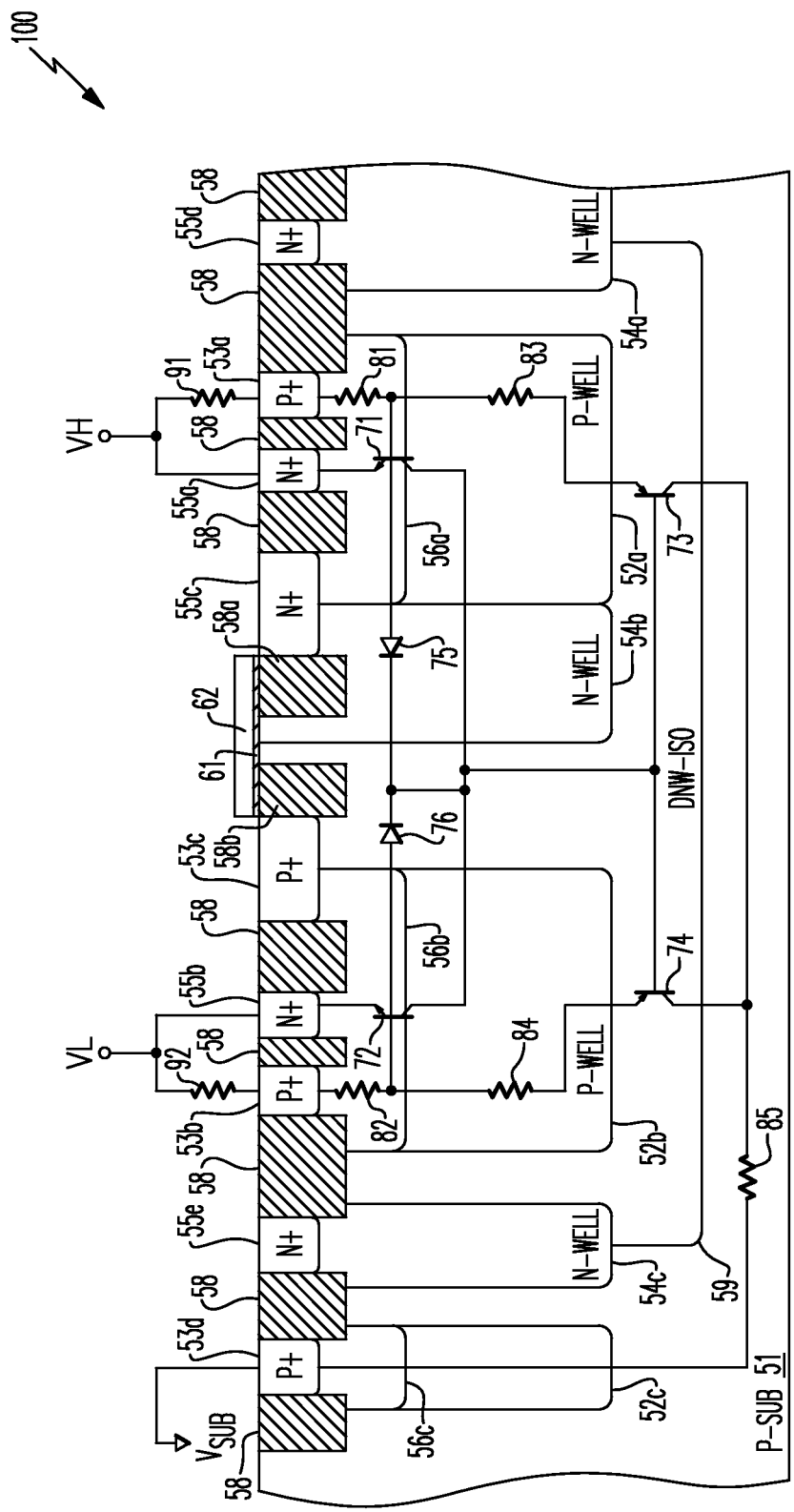
FIG. 3C is an annotated version of the cross-section of FIG. 3B showing certain circuit devices.

FIG. 3A is a top plan view annular layout arrangement of a high current handling capability dual-polarity overvoltage clamp device 100 according to one embodiment. Although FIG. 3A illustrates an annular layout arrangement, layout configurations for the clamp devices herein need not be annular. For instance, a dual-polarity overvoltage clamp device can include a planar layout arrangement, such as in configurations associated with lower power handling capability specifications. FIG. 3B is a cross-section of the clamp device 100 of FIG. 3A taken along the lines 3B-3B. Additionally, FIG. 3C is an annotated version of the cross-section of FIG. 3B showing certain circuit devices.

The clamp device 100 is fabricated in a p-type substrate (P-SUB) 51, and includes a first p-type well (p-well) 52a, a second p-well 52b, a third p-well 52c, a first n-type well (n-well) 54a, a second n-well 54b, a third n-well 54c, a first p-type active (P+) region 53a, a second P+ region 53b, a third P+ region 53c, a fourth P+ region 53d, a first n-type active (N+) region 55a, a second N+ region 55b, a third N+ region 55c, a fourth N+ region 55d, a fifth N+ region 55e, a first shallow p-well (SHPW) 56a, a second SHPW 56b, a third SHPW 56c, oxide regions 58, a deep n-well isolation (DNW-ISO) region 59, a first dielectric region 61, and a first conductor 62. The clamp device 100 further includes a first terminal VH, a second terminal VL, and a substrate terminal that is electrically connected to a substrate voltage $V_{SUB}$.

For purposes of clarity, only the p-wells 52a-52c, the n-wells 54a-54c, and the DNW-ISO region 59 are illustrated in the top plan view of FIG. 3A.

As shown in FIG. 3A, the first p-well 52a is implemented as a first ring that surrounds but does not abut the first n-well 54a. Additionally, the second n-well 54b is implemented as a second ring that surrounds and abuts the first p-well 52a. Furthermore, the second p-well 52b is implemented as a third ring that surrounds but does not abut the second n-well 54b. Additionally, the third n-well 54c is implemented as a fourth ring that surrounds but does not abut the second p-well 52b. Furthermore, the third p-well 52c is implemented as a fifth ring that surrounds but does not abut the third n-well 54c. Additionally, the DNW-ISO region 59 extends beneath the first p-well 52a, beneath the second p-well 52b, beneath the second n-well 54b, beneath a portion of the first n-well 54a, and beneath a portion of the third n-well 54c.

Although FIG. 3A illustrates a top plan view of a clamp device implemented in an annular configuration in accordance with one embodiment, other configurations are possible. For example, in one embodiment, the clamp device is implemented in a planar rather than annular configuration.

In the illustrated embodiment, the first SHPW 56a and the first p-well 52a collectively operate as a first p-type well region 52a/56a, and the second SHPW 56b and the second p-well 52b operate as a second p-type well region 52b/56b. The first P+ region 53a and the first N+ region 55a are disposed in the first p-type well region 52a/56a, and the second P+ region 53b and the second N+ region 55b are disposed in the second p-type well region 52b/56b.

In the illustrated configuration, the DNW-ISO region 59 and the first and third n-wells 54a, 54c operate as an n-type isolation structure that electrically isolates the first p-type well region 52a/56a and the second p-type well region 52b/56b from the P-SUB 51. The n-type isolation structure enhances isolation of the clamp device 100 to the P-SUB 51, and permit the P-SUB 51 and the first and second p-type well regions to operate at different electrical potentials. In the illustrated configuration, the n-type isolation structure is configured to be electrically floating, which can aid in expanding a range of voltages over which the clamp device's terminals can operate. The fourth and fifth N+ regions 55d, 55e are disposed in the first and third n-wells 54a, 54c, respectively, but do not have a voltage controlled externally in this embodiment. The fourth and fifth N+ regions 55d, 55e can be used to increase a concentration of electrons of the n-type isolation structure near a surface of the P-SUB 51.

Although the clamp device 100 includes one example of an n-type isolation structure that can be used to isolate p-type well regions, the teachings herein are applicable to other configurations of n-type isolation structures. For example, an n-type isolation structures can be implemented using not only deep n-well technologies, but also to n-type buried layer (NBL) technologies.

In the illustrated configuration, the clamp device 100 is formed directly in the P-SUB 51. However, the teachings herein are applicable to other configurations, such as implementations in which a substrate includes a p-type epitaxial layer over a doped or undoped support substrate, and the clamp device 100 is fabricated in the p-type epitaxial layer. Thus, the clamp device 100 can be fabricated in a p-type region of a substrate. Although not illustrated in FIGS. 3A-3C, the P-SUB 51 typically includes other devices or structures formed therein.

The third p-well 52c, the third SHPW 56c, and the fourth P+ region 53d can operate as a guard ring of the clamp device 100. The guard ring can eliminate formation of unintended parasitic paths between the clamp device 100 and surrounding semiconductor components when integrated on-chip. In the illustrated configuration, the third p-well 52c is spaced from the n-type isolation structure to enhance latch-up immunity by reducing the injection of carriers into the P-SUB 51. In the illustrated configuration, the guard ring is electrically connected to a substrate voltage $V_{SUB}$.

The illustrated blocking voltage device 100 includes the oxide regions 58. Formation of the oxide regions 58 can involve etching trenches in the P-SUB 51, filling the trenches with a dielectric, such as silicon dioxide (SiO$_2$), and removing the excess dielectric using any suitable method, such as chemical-mechanical planarization. In certain implementations, the oxide regions 58 can be shallow trench (STI) regions or local oxidation of silicon (LOCOS) regions disposed between active regions.

The clamp device 100 can undergo back end processing to form contacts and metallization. For clarity, these details are omitted in favor of using annotated electrical connections.

As shown in FIGS. 3B and 3C, the first terminal VH of the clamp device 100 is electrically connected to the first P+ region 53a and to the first N+ region 55a. Additionally, the second terminal VL of the clamp device 100 is electrically connected to the second P+ region 53b and to the second N+ region 55b. The clamp device 100 of FIGS. 3A-3C corresponds to one embodiment of the clamp devices 7a, 7b shown in FIG. 1.

The cross-section of FIG. 3C has been annotated to show certain circuit devices of the clamp device 100, including a first resistor 81, a second resistor 82, a third resistor 83, a fourth resistor 84, a fifth resistor 85, a first diode 75, a second diode 76, a first NPN bipolar transistor 71, a second NPN bipolar transistor 72, a first PNP bipolar transistor 73, and a second PNP bipolar transistor 74. FIG. 3C has also been annotated to show a first external resistor 91 and a second external resistor 92, which can be included in certain configurations using resistive structures external to the cross-section shown in FIG. 3C. When included, the first and second external resistors 91, 92 can provide increased resistance between the first and second P+ regions 53a, 53b and the first and second terminals VH, VL, respectively. In certain configurations, the first and second external resistors 91, 92 comprise polysilicon resistors.

As shown in FIG. 3B, the clamp device 100 includes a blocking voltage tuning structure 65, which is positioned between the first N+ region 55a and the second N+ region 55b. In the illustrated configuration, the first P+ region 53a is positioned on a side of the first N+ region 55a opposite the blocking voltage tuning structure 65, and the second P+ region 53b is positioned on a side of the second N+ region 55b opposite the blocking voltage tuning structure 65.

The blocking voltage tuning structure 65 can be implemented to provide a desired protection characteristic between the first and second terminals VH, VL, such as a desired forward trigger voltage, forward holding voltage, reverse trigger voltage, and/or reverse holding voltage.

In the illustrated configuration, the third N+ region 55c is positioned along a boundary between the first p-type well region 52a/56a and the second n-well 54b. Additionally, the third P+ region 53c is positioned along a boundary between the second p-type well region 52b/56b and a native n-type region corresponding to a background doping concentration of the DNW-ISO region 59. A first oxide region 58a is positioned between the third N+ region 55c and an edge of the second n-well 54b, and a second oxide region 58b is positioned between the third P+ region 53c and the edge of the second n-well 54b. The first conductor 62 is formed over the first dielectric region 61, and the first conductor 62 and the first dielectric region 61 extend over the P-SUB 51 between the third P+ region 53c and the third N+ region 55c.

The blocking voltage tuning structure 65 provides fine-tuned control over protection characteristics between the first terminal VH and the second terminal VL. In particular, the blocking voltage tuning structure 65 includes blocking junctions or interfaces between p-type semiconductor regions and n-type semiconductor regions, and the geometry and/or doping concentrations of the p-type and n-type regions can be controlled to achieve desired protection characteristics.

For example, the blocking voltage tuning structure 65 includes a first blocking junction associated with an interface between p-well 52a/SHPW 56a and n-well 54b/N+ region 55c. The first blocking junction can be used to control a breakdown voltage of the first diode 75 and/or a base-to-collector breakdown voltage of the first NPN bipolar transistor 71. Additionally, the blocking voltage tuning structure 65 includes a second blocking junction associated with an interface between p-well 52b/SHPW 56b/P+ region 53c and a native n-type region associated with a background doping concentration of the DNW-ISO region 59. The second blocking junction can be used to control a breakdown voltage of the second diode 76 and/or a base-to-collector breakdown voltage of the second NPN bipolar transistor 72.

The illustrated configuration also includes the first conductor 62, which does not operate as a gate of a FET in this embodiment, since semiconductor regions of different doping polarities are disposed on opposite sides of the first conductor 62. However, the first conductor 62 impacts the operation of the clamp device 100 by facilitating current conduction closer to the semiconductor surface. Additionally, the spacing between first and second oxides regions 58a, 58b reduces formation of deep inter-active oxide region size, which facilitates carrier conduction path and accelerates clamping function upon device activation.

By selecting a particular configuration of the blocking voltage tuning structure 65, a protection characteristic desirable for a particular application can be obtained.

The clamp device 100 also includes p-type well regions that are used in part to achieve a desired protection characteristic. For example, a SHPW can have a higher doping concentration than a p-well, and thus a SHPW can be used to increase a concentration of holes relative to a configuration using only a p-well.

In the illustrated configuration, the clamp device 100 includes a first p-type well region that includes the first p-well 52a and the first SHPW 56a, and a second p-type well region that includes the second p-well 52b and the second SHPW 56b. However, the clamp device 100 can be modified to include p-type well regions that are implemented using a different combination of p-type well structures to achieve a desired overall protection response.

For example, in certain configurations, the first SHPW 56a can be omitted from the first p-type well region and/or the second SHPW 56b can be omitted from the second p-type well region. Omitting the first and second SHPWs 56a, 56b can increase a resistance of the first and second resistors 81, 82, respectively. Additionally, omitting the first and second SHPWs 56a, 56b can decrease carrier concentration in the first and second NPN bipolar transistors 71, 72 and first and second diodes 75, 76.

In other configurations, the first p-well 52a can be omitted from the first p-type well region and/or the second p-well 52b can be omitted from the second p-type well region. Omitting the first and second p-wells 56a, 56b can increase a resistance of the third and fourth resistors 83, 84 and decrease carrier concentration in the first and second PNP bipolar transistors 73, 74.

Thus, the configurations of the first and second p-type well regions can also be used in part to tune protection characteristics.

Figure 4:
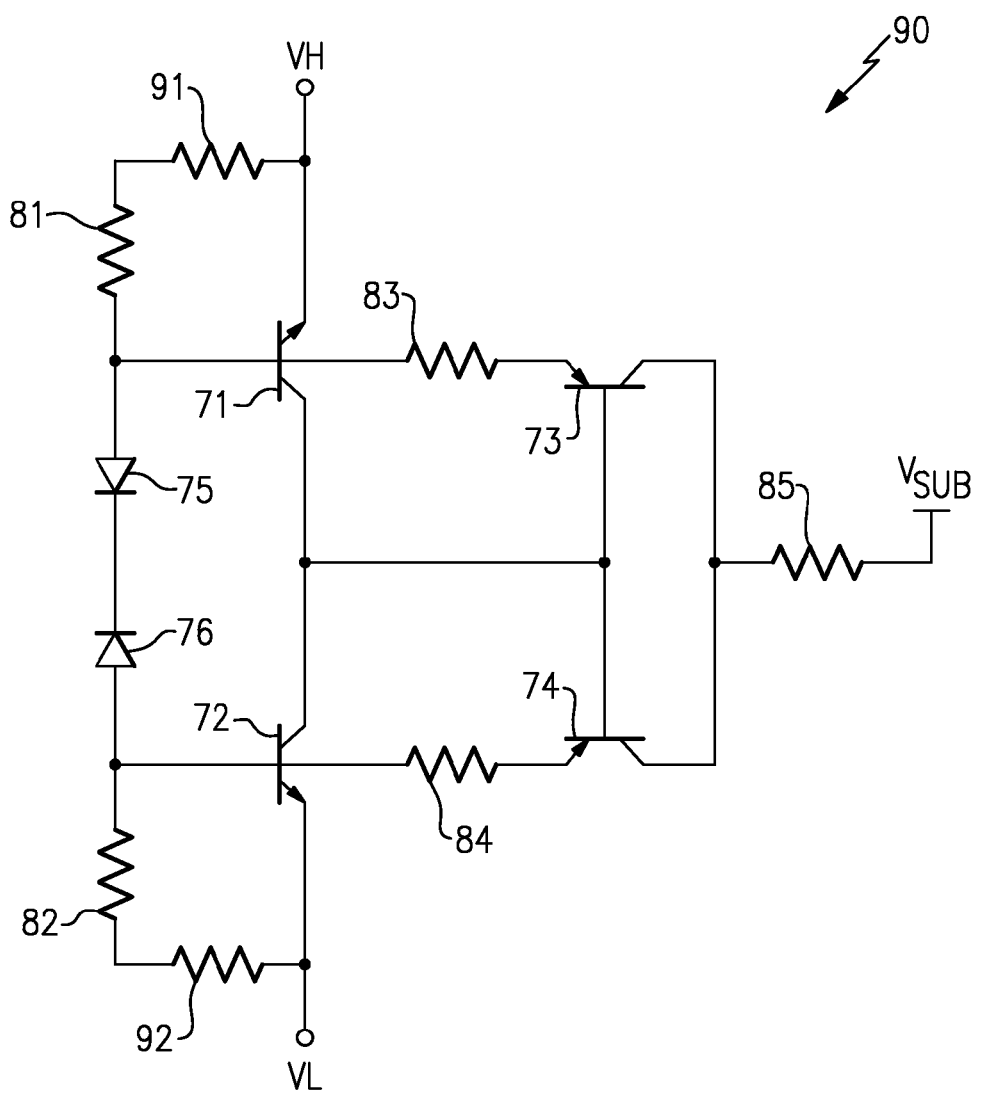
FIG. 4 shows a circuit diagram of the dual-polarity overvoltage clamp device of FIGS. 3A-3C.

FIG. 4 shows a circuit diagram 90 of the clamp device 100 of FIGS. 3A-3C. The circuit diagram 90 includes the first resistor 81, the second resistor 82, the third resistor 83, the fourth resistor 84, the fifth resistor 85, the first diode 75, the second diode 76, the first PNP bipolar transistor 71, the second PNP bipolar transistor 72, the first NPN bipolar transistor 73, the second NPN bipolar transistor 74, the first external resistor 91, and the second external resistor 92. Electrical connections between the circuit components and the first terminal VH, the second terminal VL, and the substrate voltage $V_{SUB}$ have been illustrated.

With reference to FIGS. 3A-4, the clamp device 100 includes a first silicon-controlled rectifier (SCR) structure between the clamp device's first terminal VH and the substrate voltage $V_{SUB}$. The first SCR structure is associated with the first NPN bipolar transistor 71 and the first PNP bipolar transistor 73, which are cross-coupled. The clamp device 100 includes a second SCR structure between the clamp device's second terminal VL and the substrate voltage $V_{SUB}$. The second SCR structure is associated with the second NPN bipolar transistor 72 and the second PNP bipolar transistor 74, which are cross-coupled. The first and second SCR structures can be tuned to provide high isolation between the first and second terminals VH, VL and the substrate voltage $V_{SUB}$.

The clamp device's I-V characteristics between the first terminal VH and the second terminal VL can be controlled using the first and second resistors 81, 82, the first and second diodes 75, 76, the first and second NPN bipolar transistors 71, 72, and the first and second external resistors 91, 92.

For example, when the voltage difference between the first and second terminals VH, VL is positive and increases during a transient electrical event, the second diode 76/base-to-collector junction of the second NPN bipolar transistor 72 can operate as a blocking junction. Thus, the clamp device's forward trigger and holding voltages can be controlled by selection of the size, spacing, and doping concentrations of active regions and wells associated with the blocking junction. The forward trigger and holding voltages can also be controlled in part by the resistors 81, 82, 91, 92, which operate in an electrical path between the first and second terminals VH, VL.

Similarly, when the voltage difference between the first and second terminals VH, VL is negative, the first diode 75/base-to-collector junction of the first NPN bipolar transistor 71 can operate as a blocking junction. The clamp device's forward trigger and holding voltages can be controlled by selection of the size, spacing, and doping concentrations of active regions and wells associated with the blocking junction as well as by selection of the resistances of the resistors 81, 82, 91, 92.

Figure 5A:
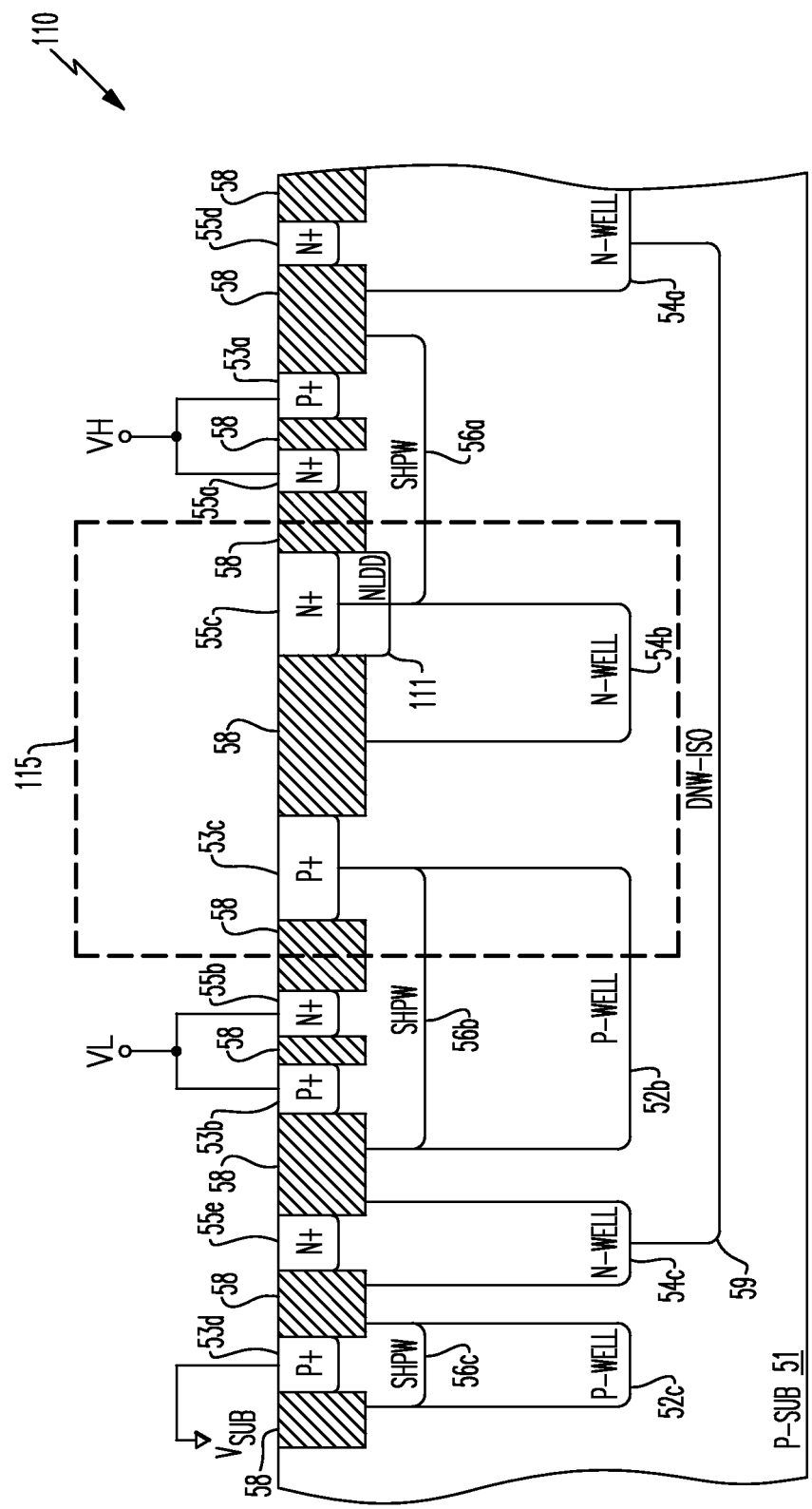
FIGS. 5A-5E are cross-sections of various embodiments of dual-polarity overvoltage clamp devices.

FIG. 5A is a cross-section of a clamp device 110 according to another embodiment. The clamp device 110 of FIG. 5A is similar to the clamp device 100 of FIGS. 3A-3C, except that the clamp device 110 includes a different configuration of a first p-type well region and of a blocking voltage tuning structure 115.

For example, in contrast to the first p-type well region of FIGS. 3A-3C which includes both the first p-well 52a and the first SHPW 56a, the illustrated first p-type well region only includes the first SHPW 56a. By omitting the first p-well 52a, the clamp device 110 can have a less abrupt and shallower blocking junction formation, allowing for a finer tuning of the breakdown voltage, for instance 11.5 to 13 V. Omitting the first p-well 52a can also result in the clamp device 110 having a higher breakdown voltage between the first terminal VH and the substrate voltage $V_{SUB}$ when the voltage of the first terminal VH is below the substrate voltage reference.

The blocking voltage tuning structure 115 of FIG. 5A includes the third P+ region 53c, the third N+ active region 55c, and an n-type lightly doped drain (NLDD) region 111. The illustrated blocking voltage tuning structure 115 omits the first dielectric region 61 the first conductor 62 shown in FIGS. 3B-3C.

Including the NLDD region 111 can increase a concentration of electrons at the first blocking junction between the second n-well 54b and the first p-type well region, but also contributes to create lighter doping at the metallurgical junction and a less abrupt blocking junction formation, which can increase the breakdown voltage of the first blocking junction to SHPW 56a.

Additional details of the clamp device 110 can be similar to those described earlier.

Figure 5B:
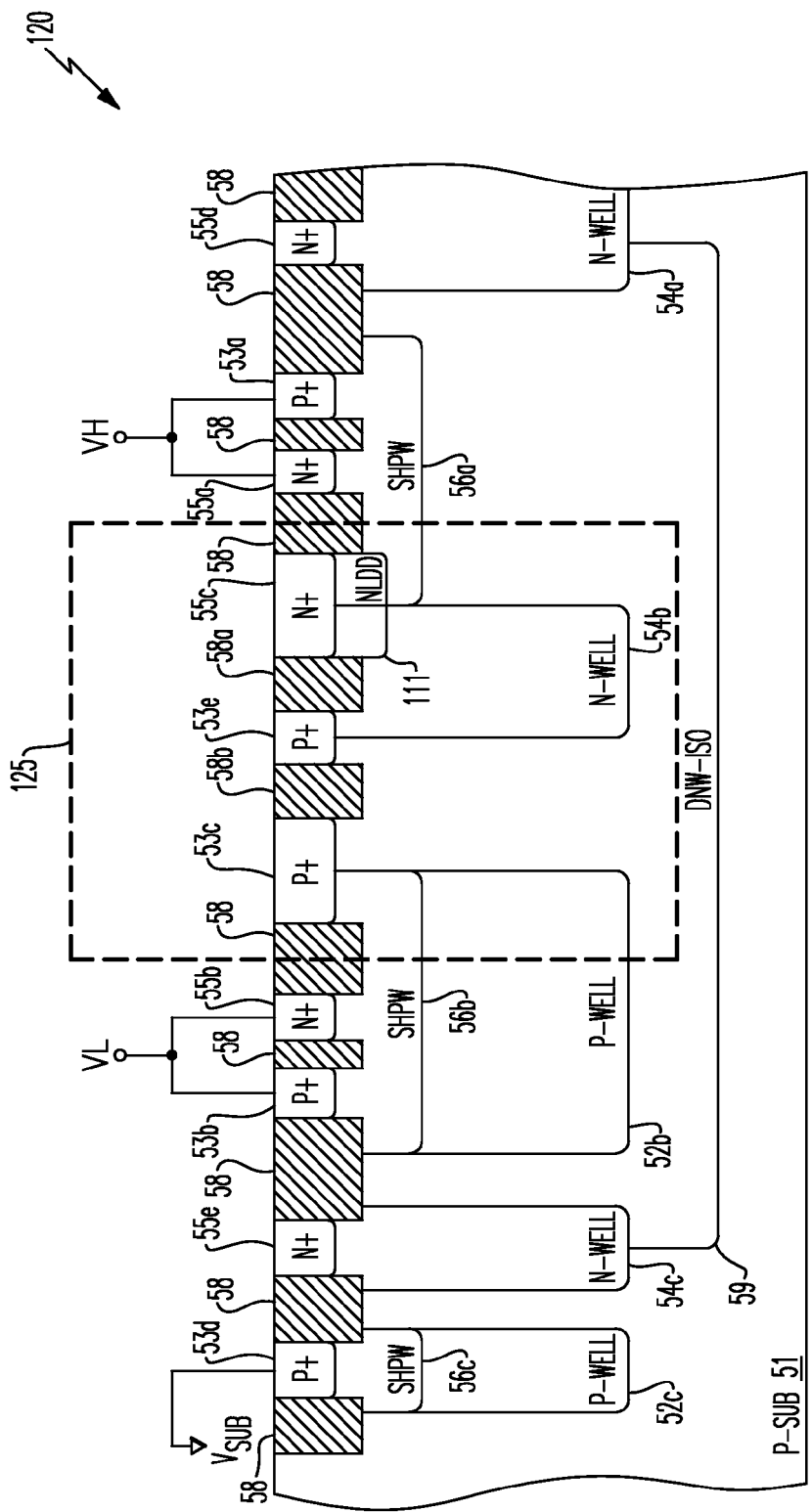

FIG. 5B is a cross-section of a clamp device 120 according to another embodiment. The clamp device 120 of FIG. 5B is similar to the clamp device 110 of FIG. 5A, except that the clamp device 120 includes a different configuration of a blocking voltage tuning structure 125.

The blocking voltage tuning structure 125 of FIG. 5B is similar to the blocking voltage tuning structure 115 of FIG. 5A, except that the blocking voltage tuning structure 125 further includes a fifth P+ region 53e, which is positioned between the third N+ region 55c and the third P+ region 53c. A first oxide region 58a separates the fifth P+ region 53e and the third N+ region 55c, and a second oxide region 58b separates the fifth P+ region 53e and the third P+ region 53c. Including the fifth P+ region 53e can allow for a metallurgical junction formation at the center of the device that can be alternatively driven by a detection circuit connected between VH and VL to selectively current injection into the P+ 53e region.

In certain configurations, the fifth P+ region 53e can be electrically connected to triggering control circuitry that is external to the cross-section shown in FIG. 3E. For example, in one embodiment, the triggering control circuitry includes a first blocking diode structure, a second blocking diode structure, and a triggering control resistor. Additionally, the anodes of the first and second blocking diode structures are electrically connected to one another, and the cathodes of the first and second blocking diode structures are electrically connected to the first and second terminals VH, VL, respectively. Additionally, the triggering control resistor is electrically connected between the fifth P+ region 53e and the anodes of the first and second blocking diode structures. The triggering control circuitry can provide external triggering control over the clamp device 120, and can be used for protecting highly-sensitive transceiver interfaces with fast turn-on speed specifications. Thus, the illustrated embodiment can be used to provide relatively high holding voltage with fast response time.

Additional details of the clamp device 120 can be similar to those described earlier.

Figure 5C:
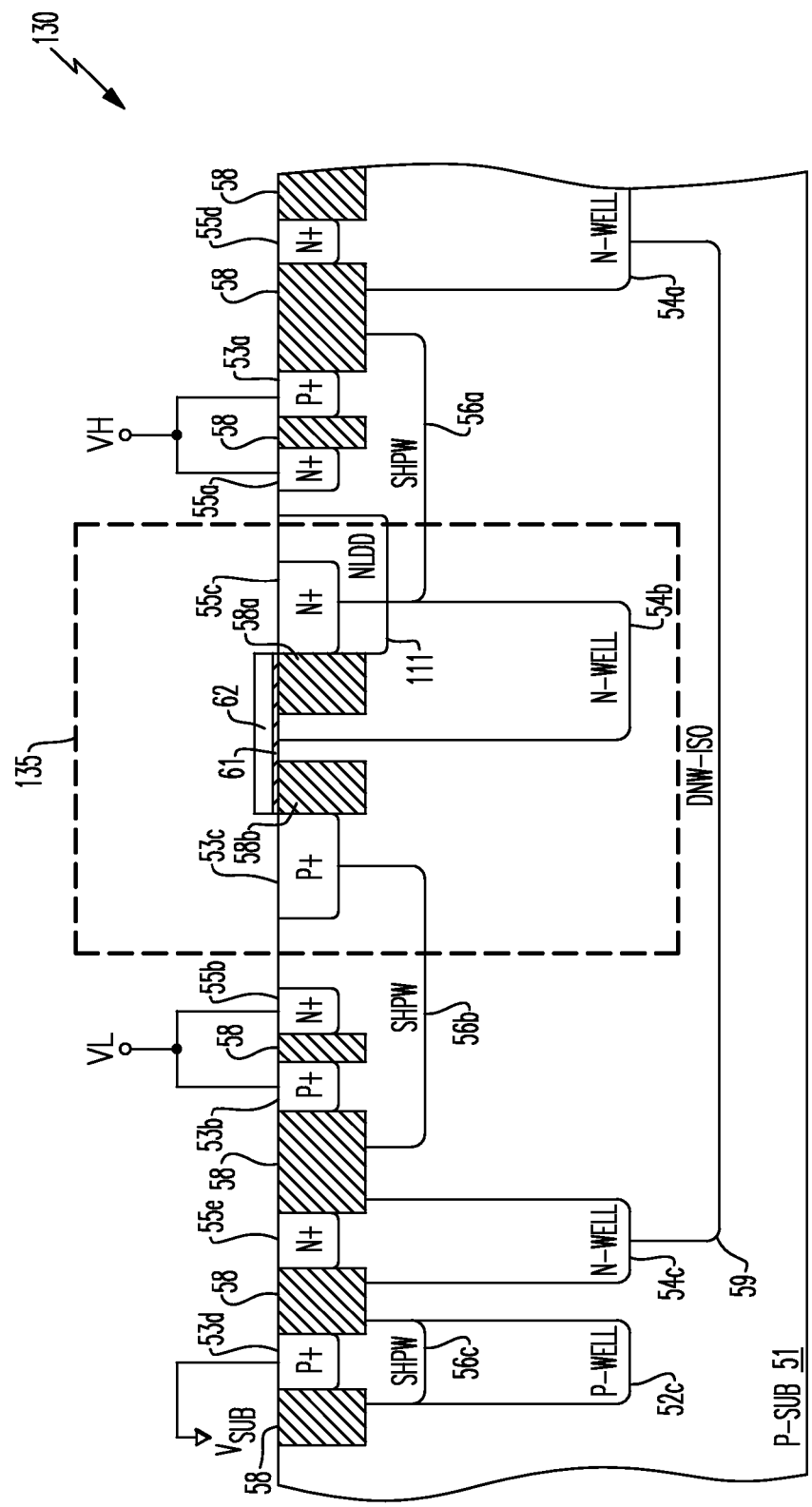

FIG. 5C is a cross-section of a clamp device 130 according to another embodiment. The clamp device 130 of FIG. 5C is similar to the clamp device 100 of FIGS. 3A-3C, except that the clamp device 130 includes a different configuration of p-type well regions and of a blocking voltage tuning structure 130.

For example, in contrast to the first p-type well region of FIGS. 3A-3C which includes both the first p-well 52a and the first SHPW 56a, the illustrated first p-type well region only includes the first SHPW 56a. Additionally, in contrast to the second p-type well region of FIGS. 3A-3C which includes both the second p-well 52b and the second SHPW 56b, the illustrated second p-type well region only includes the second SHPW 56b. Omitting the first and second p-wells 52a, 52b can result in a shallower blocking junction region between lightly doped DNW-ISO region 59 and the p-type region formed by P+ region 53c and SHPW 56b, leading to a higher breakdown when the voltage of the first terminal VH is higher than the voltage of the second terminal VL, for instance, in the range of 15 V to 20 V in certain processes.

The blocking voltage tuning structure 135 of FIG. 5C is similar to the blocking voltage tuning structure 65 of FIG. 3B, except that the blocking voltage tuning structure 135 further includes the NLDD region 111. The NLDD region 111 can increase the concentration of electrons near the interface between the second n-well 54b and the first p-type well region, which can create lighter doping at the metallurgical junction and a less abrupt blocking junction formation, which can increase the breakdown voltage of the first blocking junction to SHPW 56a.

Additional details of the clamp device 130 can be similar to those described earlier.

Figure 5D:
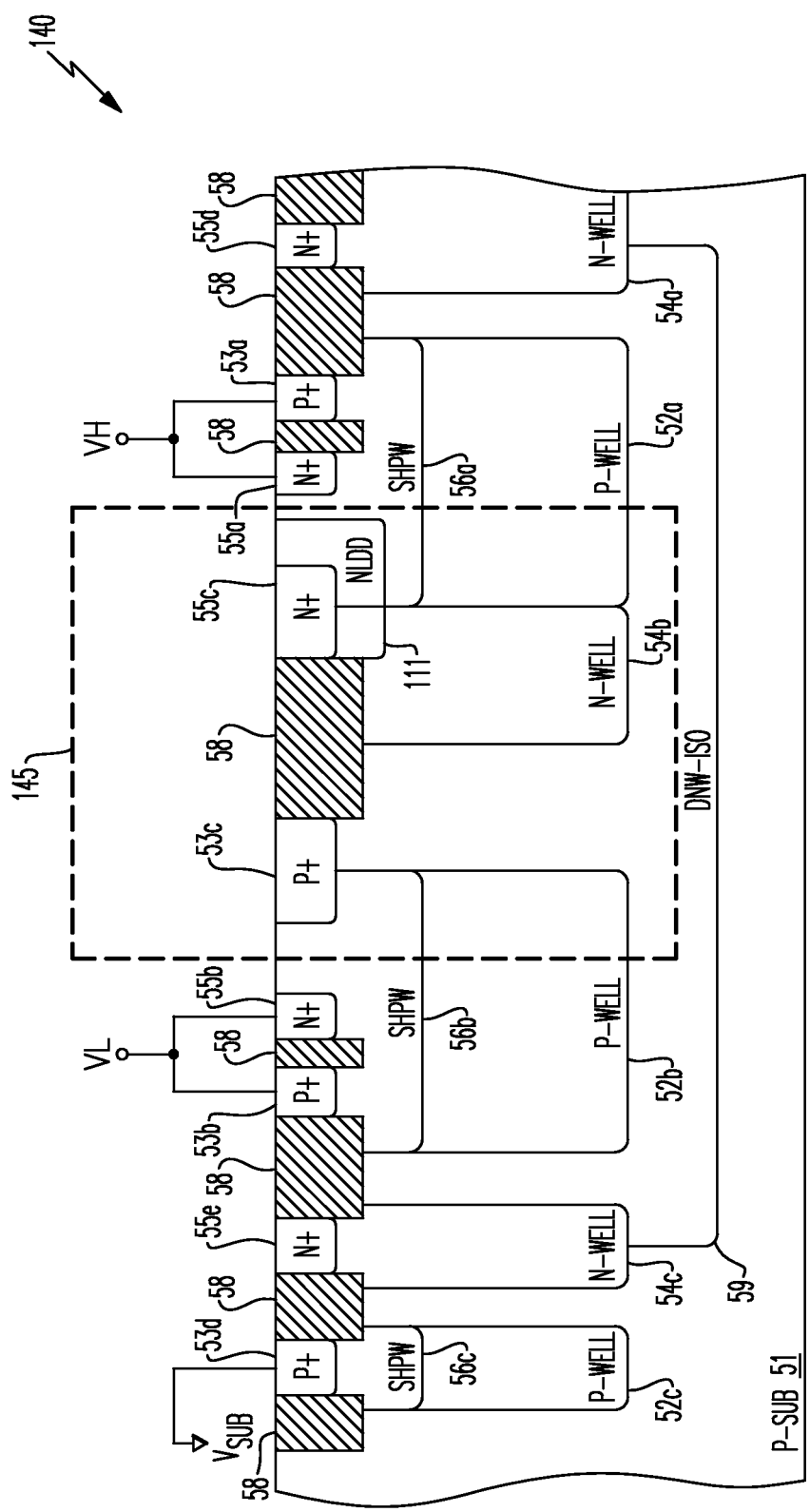

FIG. 5D is a cross-section of a clamp device 140 according to another embodiment. The clamp device 140 of FIG. 5D is similar to the clamp device 100 of FIGS. 3A-3C, except that the clamp device 140 includes a different configuration of a blocking voltage tuning structure 145.

For example, in contrast to the blocking voltage tuning structure 65 of FIG. 3B, the blocking voltage tuning structure 145 of FIG. 5D omits the first dielectric region 61 and first conductor 62 in favor of including an oxide region 58 between the third P+ region 53c and the third N+ region 55c. Configuring the clamp device 140 in this manner can reduce standing leakage in the device, but also may slow device activation and clamping function during overvoltage conditions. This configuration can be included, for example, for interface applications with more stringent power consumption and leakage constraints.

Additional details of the clamp device 140 can be similar to those described earlier.

Figure 5E:
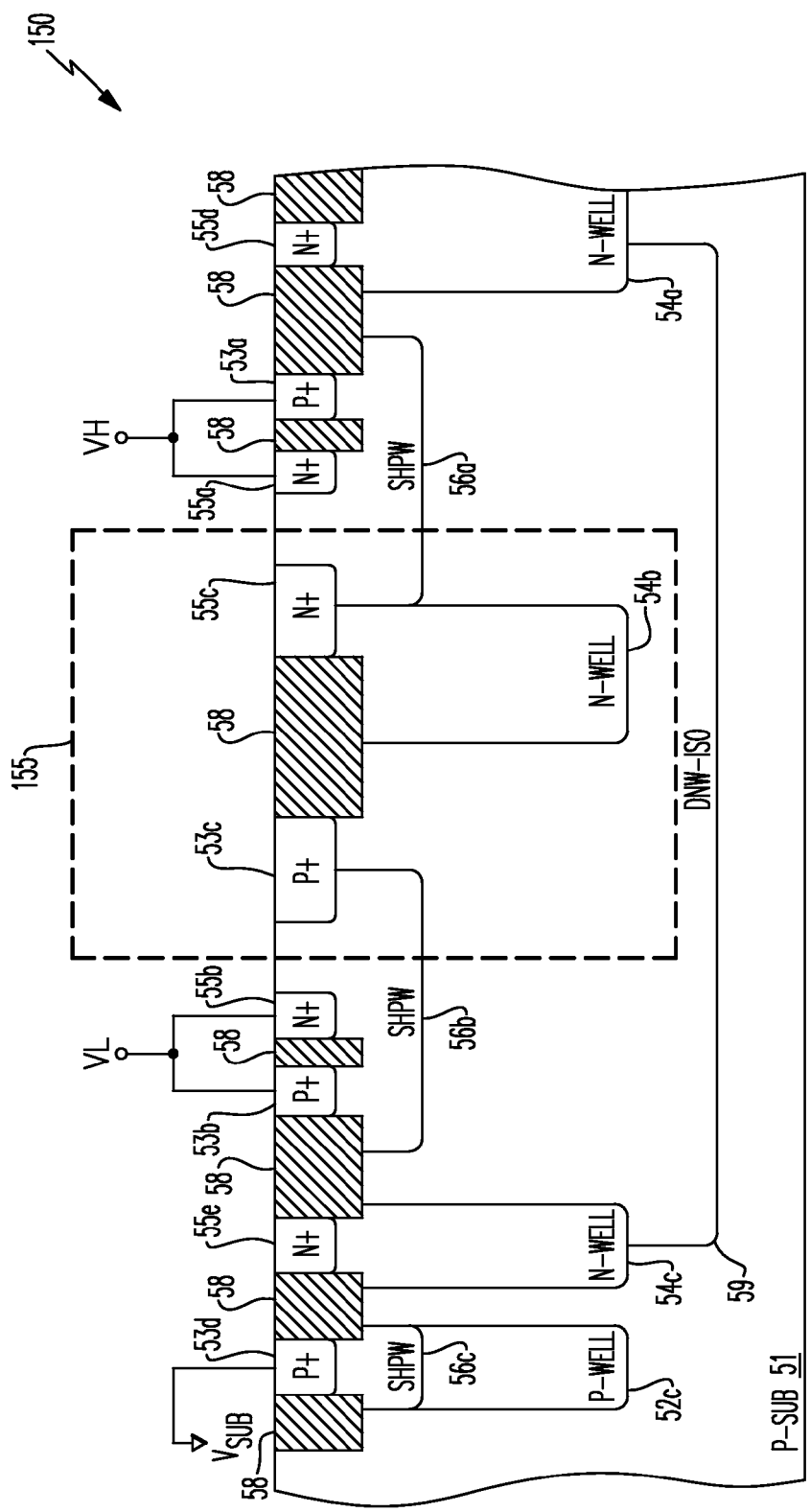

FIG. 5E is a cross-section of a clamp device 150 according to another embodiment. The clamp device 150 of FIG. 5E is similar to the clamp device 140 of FIG. 5D, except that the clamp device 150 illustrates a configuration in which the first and second p-wells 52a, 52b have been omitted and which includes a different configuration of a blocking voltage tuning structure 155.

Omitting the first and second p-wells 52a, 52b can decrease a concentration of holes in the first and second p-type well regions relative to the configuration shown in FIG. 5D.

Additionally, in contrast to the blocking voltage tuning structure 145 of FIG. 5D, the blocking voltage tuning structure 155 of FIG. 5E omits the NLDD region 111. This configuration provides flexibility for fine tuning of the forward and reverse breakdown voltages between the first and second terminals VH and VL, respectively. Compared to the configuration shown in FIG. 5D, the configuration shown in FIG. 5E provides a lower positive breakdown voltage between VH to VL and similar breakdown voltage but lower leakage from VL to VH.

Additional details of the clamp device 150 can be similar to those described earlier.

Figure 6A:
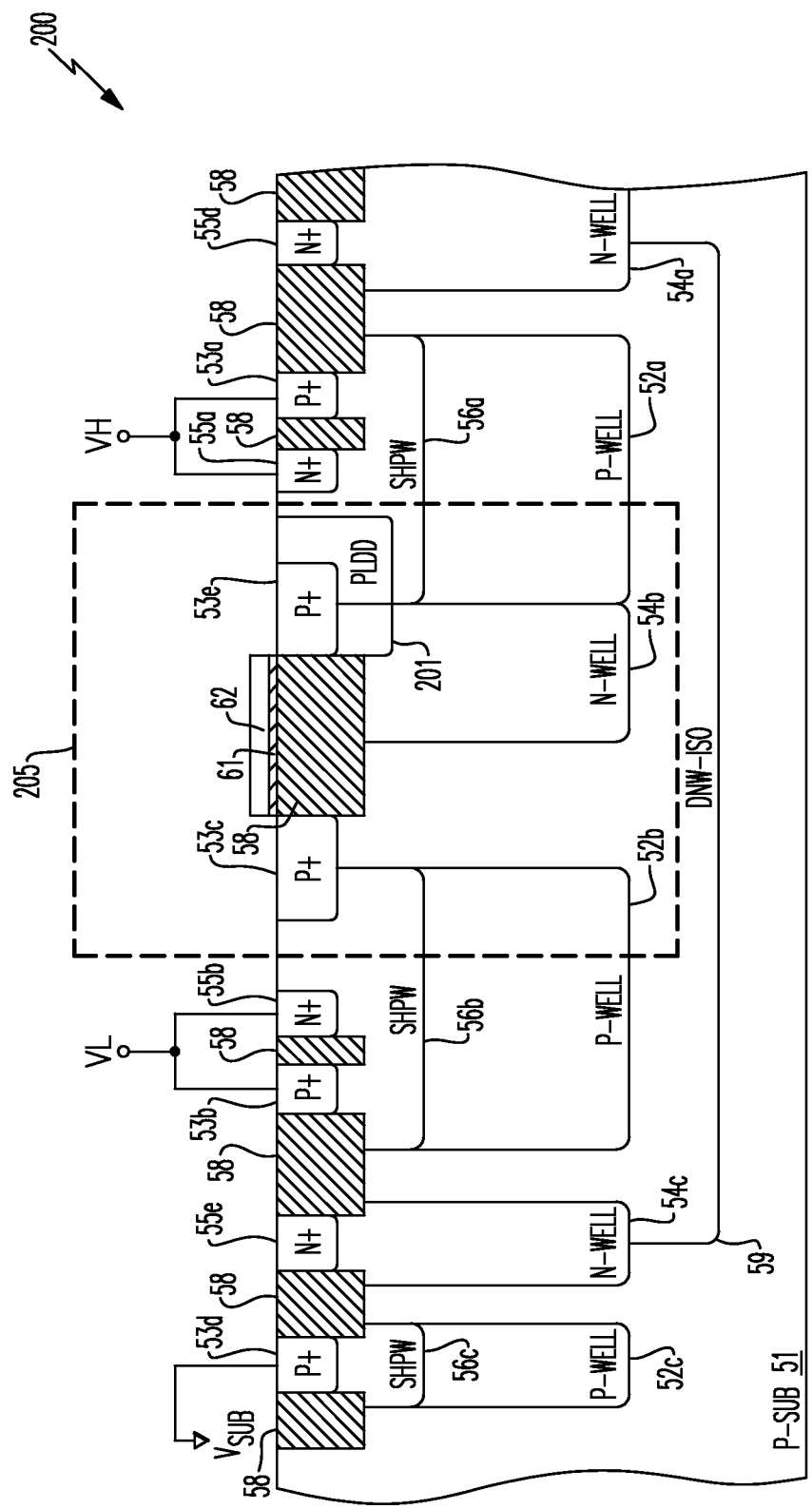
FIG. 6A is a cross-section of a dual-polarity overvoltage clamp device according to another embodiment.
Figure 6B:
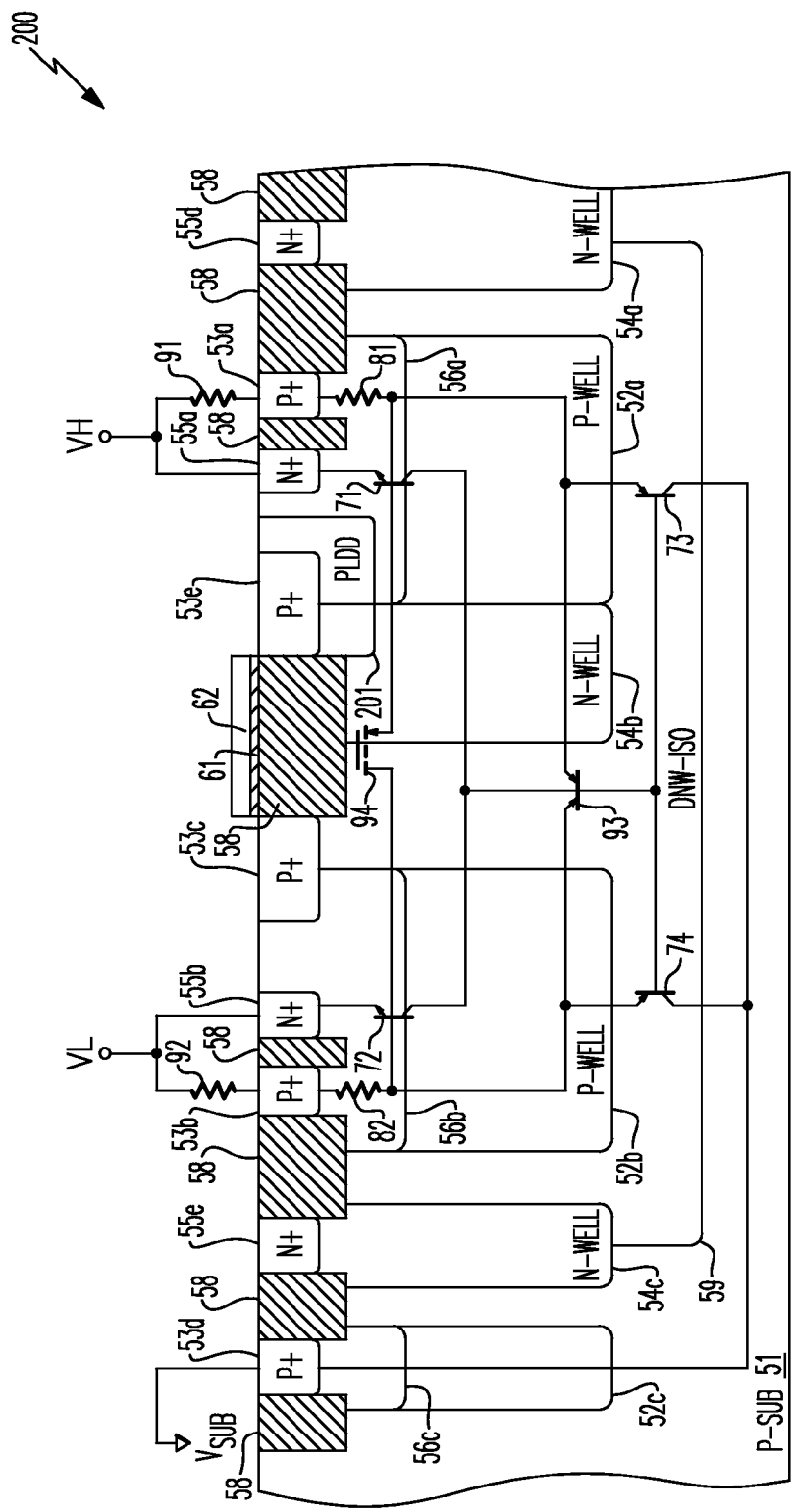
FIG. 6B is an annotated version of the cross-section of FIG. 6A showing certain circuit devices.

FIG. 6A is a cross-section of a clamp device 200 according to another embodiment. FIG. 6B is an annotated version of the cross-section of FIG. 6A showing certain circuit devices.

The clamp device 200 of FIGS. 6A-6B is similar to the clamp device 100 of FIGS. 3A-3C, except that the clamp device 200 includes a different configuration of a blocking voltage tuning structure 205.

For example, in contrast to the blocking voltage tuning structure 65 of FIG. 3B, the blocking voltage tuning structure 205 of FIG. 6A omits the third N+ region 55c in favor of including a fifth P+ region 53e. Additionally, the blocking voltage tuning structure 65 further includes a p-type lightly doped drain (PLDD) region 201 formed beneath the fifth P+ region 53e. Furthermore, an oxide region 58 extends between the third and fifth P+ regions 53c, 53e, and the first dielectric region 61 and the first conductor 62 are formed over the oxide region.

In contrast to the clamp device 100 of FIGS. 3A-3B, the first conductor 62 operates as a gate of a field-effect transistor (FET). In particular, the third and fifth P+ regions 53c, 53e are positioned on opposite ends of the first conductor 62, and an n-type semiconductor region is beneath the first conductor 62. Thus, at sufficiently low gate voltage levels, an inversion layer can be generated in the n-type semiconductor region, thereby providing a channel impacting the conduction between the third and fifth P+ regions 53c, 53e.

Figure 7:
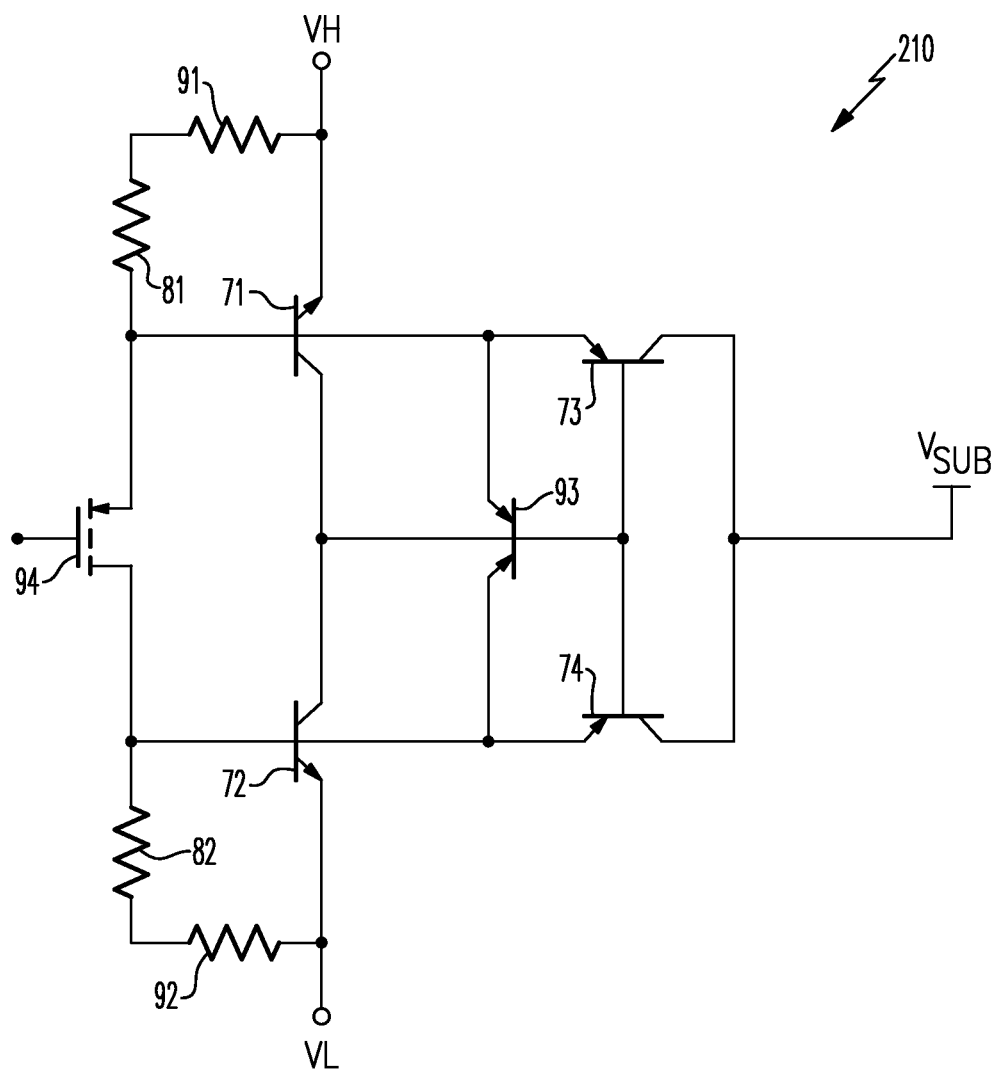
FIG. 7 shows a circuit diagram of the dual-polarity overvoltage clamp device of FIGS. 6A-6B.

The cross-section of FIG. 6B has been annotated to show certain circuit devices of the clamp device 200, including the first resistor 81, the second resistor 82, the first NPN bipolar transistor 71, the second NPN bipolar transistor 72, the first PNP bipolar transistor 73, the second PNP bipolar transistor 74, the first external resistor 91, and the second external resistor 92, which can be as described earlier. FIG. 6B has also been annotated to include a bidirectional bipolar transistor 93 and a p-type field effect transistor (PFET) 94. FIG. 7 shows a circuit diagram 210 that includes the circuit devices shown in FIG. 6B.

With reference to FIGS. 6A-7, the PNP bidirectional bipolar transistor 93 can operate bidirectionally, and an operation of the emitter/collector and the collector/emitter as emitter and collector can depend on the voltage conditions of the first and second terminals VH, VL.

The PNP bidirectional bipolar transistor 93 and the first NPN bipolar transistor 71 are cross-coupled, and operate as a first SCR between the first terminal VH and the second terminal VL. The PNP bidirectional bipolar transistor 93 and the first NPN bipolar transistor 71 are arranged in feedback such that an increase in the collector current of the first NPN bipolar transistor 71 increases the base current of the PNP bidirectional bipolar transistor 93 and an increase in the collector current of the PNP bidirectional bipolar transistor 93 increases the base current of the first NPN bipolar transistor 71.

When the voltage difference between the first and second terminals VH, VL during a transient electrical event reaches a reverse trigger voltage of the clamp device 200, the feedback between the PNP bidirectional bipolar transistor 93 and the first NPN bipolar transistor 71 can be regenerative and the clamp device 200 can operate in a low-impedance state. Thereafter, the feedback between the transistors can maintain the clamp device 200 in the low-impedance state as long as the voltage difference between the first and second terminals VH, VL is less than a reverse holding voltage of the clamp device 200.

The PNP bidirectional bipolar transistor 93 and the second NPN bipolar transistor 72 are also cross-coupled, and operate as a second SCR between the second terminal VL and the first terminal VH. As the voltage difference between the second terminal VL and the first terminal VH reaches a forward trigger voltage of the clamp device 200, the feedback between the PNP bidirectional bipolar transistor 93 and the second NPN bipolar transistor 72 can be regenerative and the clamp device 200 can operate in a low-impedance state. Thereafter, the feedback between the transistors can maintain the clamp device 200 in the low-impedance state as long as the voltage difference between the first and second terminals VH, VL is greater than the clamp device's forward holding voltage.

The reverse trigger and holding voltages of the clamp device 200 can be tuned by controlling the gain and conduction strength of the PNP bidirectional bipolar transistor 93 relative to the gain and conduction strength of the first NPN bipolar transistor 71 as well as by selecting the resistance across the base-emitter junction of the first NPN bipolar transistor 71. Similarly, the forward trigger and holding voltages of the clamp device 200 can be tuned by controlling the gain and conduction strength of the PNP bidirectional bipolar transistor 93 relative to the gain and conduction strength of the second NPN bipolar transistor 72 and by selecting the resistance across the base-emitter junction of the second NPN bipolar transistor 72.

The size, spacing, and doping concentrations of active regions and wells associated with the PNP bidirectional bipolar transistor 93 and the first and second NPN bipolar transistors 71, 72 can be selected to provide fine-tuned control of the trigger and holding voltage characteristics to enable the clamp device 200 to be implemented in an application associated with a particular transceiver interface.

The PFET 94 also can be used in part to control the dual polarity trigger and holding voltages of the clamp device 200 and/or to provide additional control in the turn-on response or speed of the clamp device 200.

For example, the PFET 94 can enhance protection against stress conditions between the first and second terminals VH, VL by activating and providing current into the bases of the first and/or second NPN bipolar transistors 71, 72 during a transient electrical event. Additionally, parasitic capacitances of the PFET 94 can provide displacement currents that can expedite or speed-up the activation of the clamp device 200 when a transient electrical event causes the voltage difference between the first and second terminals VH, VL to change with time. Thus, including the PFET 94 can expedite the clamp device's response during a stress condition. However, including the PFET 94 can also increase the clamp device's off-state power consumption, since the PFET 94 can have an associated leakage current.

Additional details of the clamp device 200 can be similar to those described earlier.

Figure 8A:
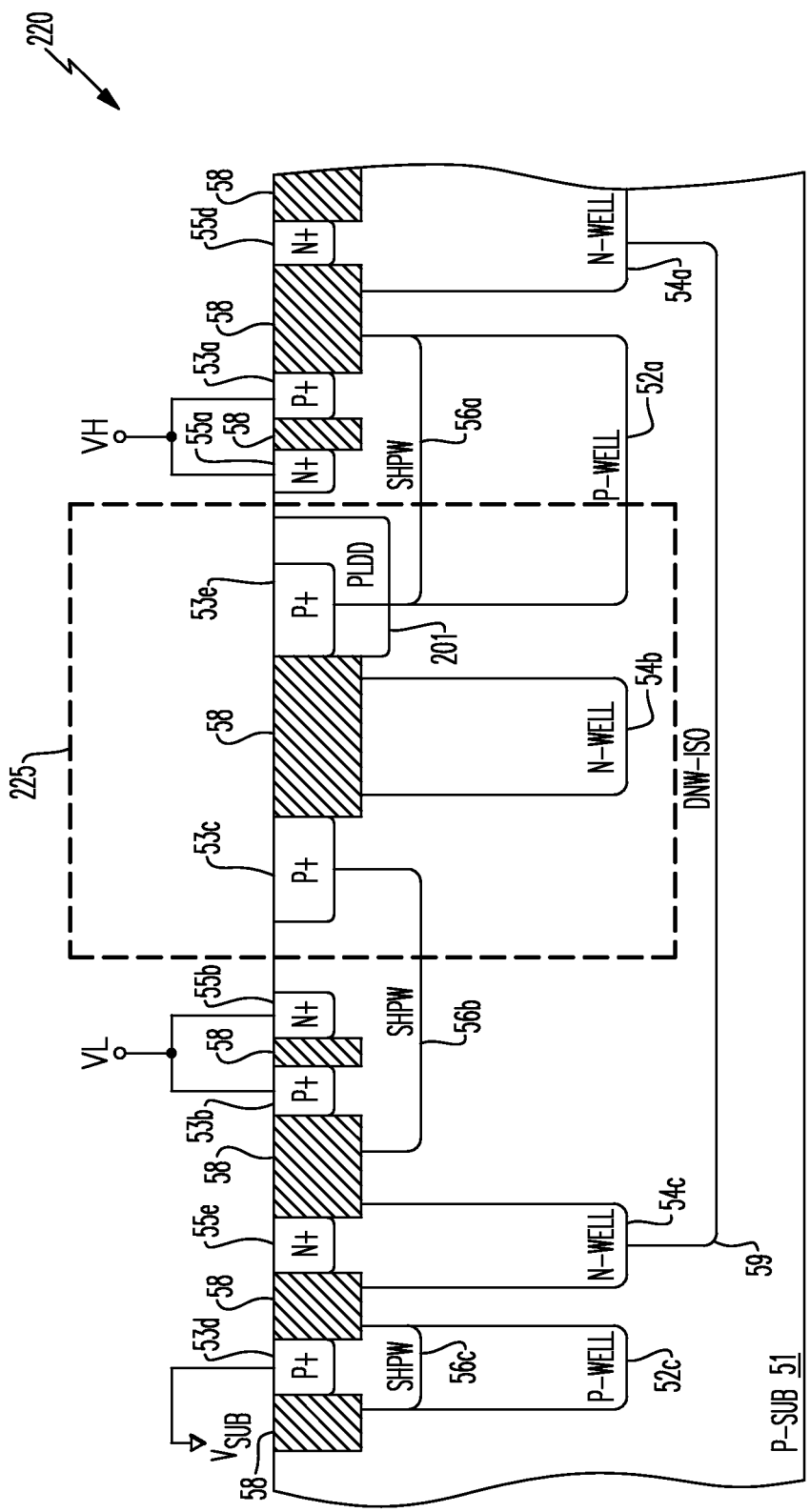
FIGS. 8A-8E are cross-sections of various embodiments of dual-polarity overvoltage clamp devices.

FIG. 8A is a cross-section of a clamp device 220 according to another embodiment. The clamp device 220 of FIG. 8A is similar to the clamp device 200 of FIGS. 6A-6B, except that the clamp device 220 includes a different configuration of a second p-type well region and of a blocking voltage tuning structure 225.

For example, in contrast to the second p-type well region of FIGS. 6A-6B which includes both the second p-well 52b and the second SHPW 56b, the illustrated second p-type well region only includes the second SHPW 56b. By omitting the second p-well 52b, the clamp device 220 can have a lower VH to VL blocking junction.

The blocking voltage tuning structure 225 of FIG. 8A is similar to the blocking voltage tuning structure 205 of FIG. 6A, except that the second n-well 54b of the blocking voltage tuning structure 225 is spaced apart from the first p-well 52a. Configuring the clamp device 220 in this manner can reduce a concentration of electrons at a blocking junction associated with the first p-type well region 52a/56a, which can increase the blocking junction's breakdown voltage. Thus, the clamp device 220 can have a high reverse voltage triggering voltage from VL to VH.

Additional details of the clamp device 220 can be similar to those described earlier.

Figure 8B:
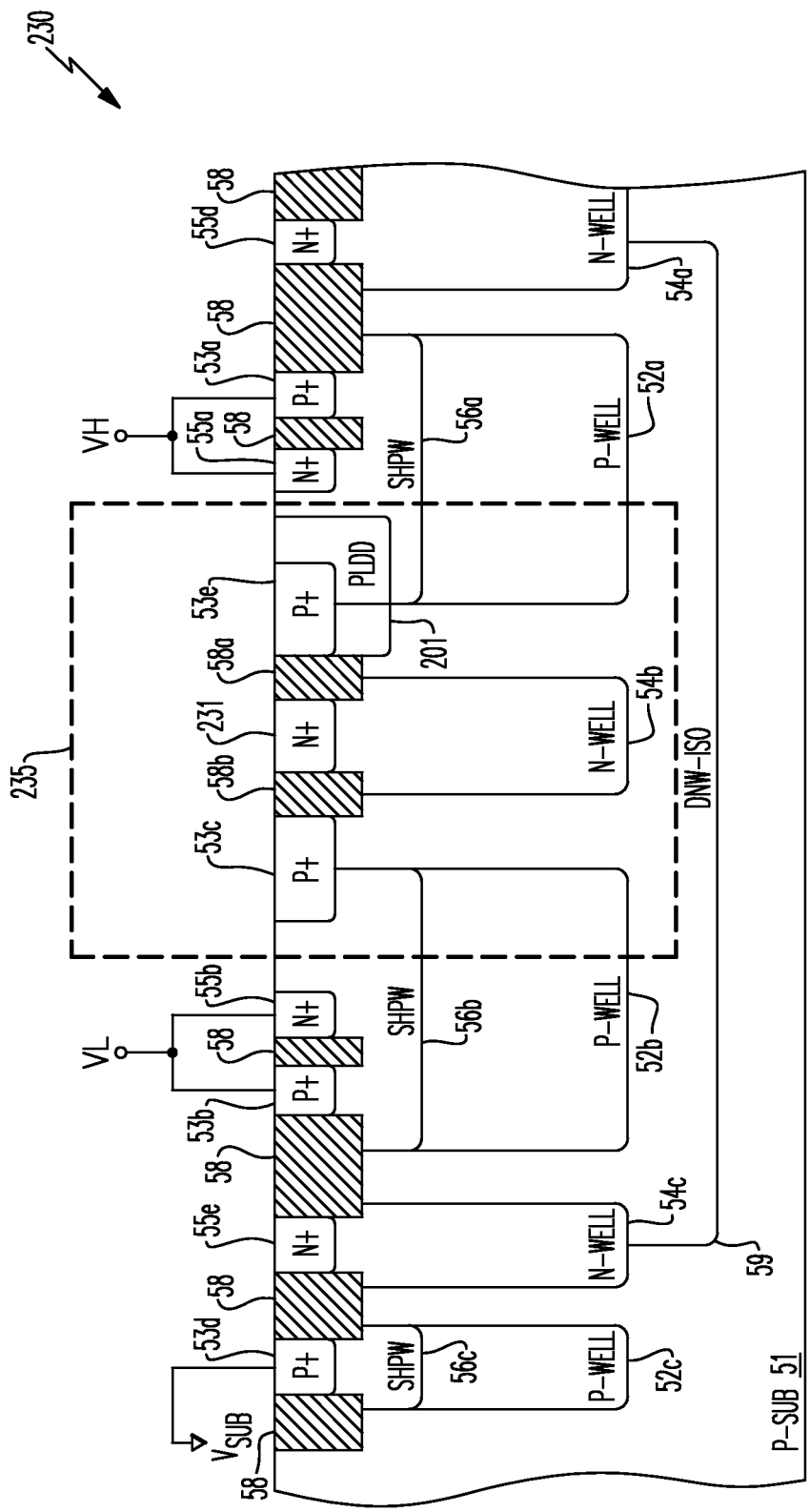

FIG. 8B is a cross-section of a clamp device 230 according to another embodiment. The clamp device 230 of FIG. 8B is similar to the clamp device 200 of FIGS. 6A-6B, except that the clamp device 230 includes a different configuration of a blocking voltage tuning structure 235.

The blocking voltage tuning structure 235 of FIG. 8B is similar to the blocking voltage tuning structure 205 of FIG. 6A, except that the second n-well 54b of the blocking voltage tuning structure 235 is spaced apart from the first p-well 52a and that an N+ active region 231 is in the second n-well 54b. Spacing the second n-well 54b apart from the first p-well 52a can impact the clamp device 230 in a manner similar to that described above with respect to FIG. 8A. As shown in FIG. 8B, a first oxide region 58a separates the N+ region 231 and the fifth P+ region 53e, and a second oxide region 58b separates the N+ region 231 and the third P+ region 53c. Including the N+ region 231 in the second n-well 54b can increase a concentration of electrons in the second n-well 54b near the surface of the P-SUB 51. Thus, the clamp device 230 can have a lower standing leakage current and the option of direct external control by connection through the N+ active region 231.

Additional details of the clamp device 230 can be similar to those described earlier.

Figure 8C:
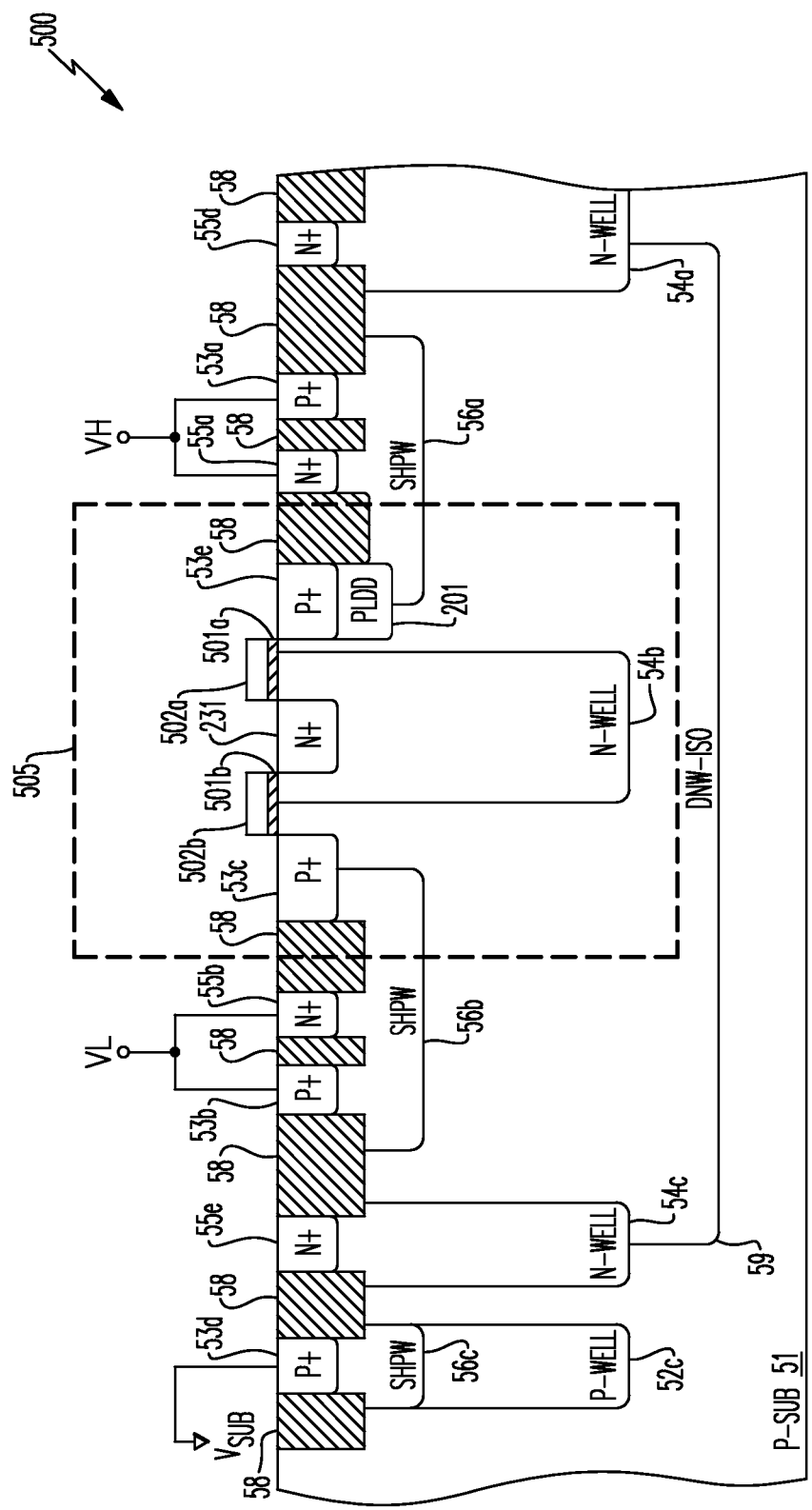

FIG. 8C is a cross-section of a clamp device 500 according to another embodiment. The clamp device 500 of FIG. 8C is similar to the clamp device 230 of FIG. 8B, except that the clamp device 500 omits the first and second p-type wells 52a, 52b and includes a different configuration of a blocking voltage tuning structure 505. Omitting the first and second p-wells 52a, 52b can decrease a concentration of holes in the first and second p-type well regions relative to the configuration shown in FIG. 8B.

The blocking voltage tuning structure 505 of FIG. 8C is similar to the blocking voltage tuning structure 235 of FIG. 8B, except that the first and second oxide regions 58a, 58b are omitted between the N+ active region 231 and the third and fifth P+ active regions 53c, 53e, respectively. Additionally, oxide regions 58 are included between the third P+ active region 53c and the second N+ active region 55b and between the fifth P+ active region 53e and the first N+ active region 55a. Furthermore, the illustrated blocking voltage tuning structure 505 includes a PLDD region 201 that is aligned with the fifth P+ active region 53e. Additionally, as shown in FIG. 8C, the blocking voltage tuning structure 505 further includes a first dielectric region 501a and a first conductor 502a positioned over a portion of the substrate between the N+ active region 231 and the fifth P+ active region 53e, and a second dielectric region 501b and a second conductor 502b positioned over a portion of the substrate between the N+ active region 231 and the third P+ active region 53c.

In comparison to the clamp device 230 of FIG. 8B, the clamp device 500 of FIG. 8C includes dummy gate structures to reduce maximum overshoot voltage, for example, by between about 20% and 60%, for instance, 50%, at the expense of an increase in leakage, for example, between about 5% and 30%, for instance, about 10%. Voltage overshoot can be mitigated by, for example, including resistors (for example, the resistors 10a-10d of FIG. 1) in series with MOS transistors of a transceiver interface. However, such transceiver interface resistors can degrade transceiver linearity and/or drive strength. Thus, transceiver interface resistors cannot be used in certain applications or can be constrained to a relatively low resistance value, for instance less than 10 Ohms. In such configurations, a clamp device is implemented to provide faster dynamic response to address design constraints in such applications at the expense of higher leakage current.

For a similar configuration of first and second p-type well regions, the clamp device 500 of FIG. 8C and the clamp device 230 of FIG. 8B can have similar DC forward and reverse blocking voltages. However, in the illustrated configuration, the first and second p-wells 52a, 52b have been omitted to provide shallower blocking junction formation. Omitting the first and second p-wells 52a, 52b can decrease carrier concentration in the first and second PNP bipolar transistors 73, 74 shown in FIG. 6B.

Additional details of the clamp device 500 can be similar to those described earlier.

Figure 8D:
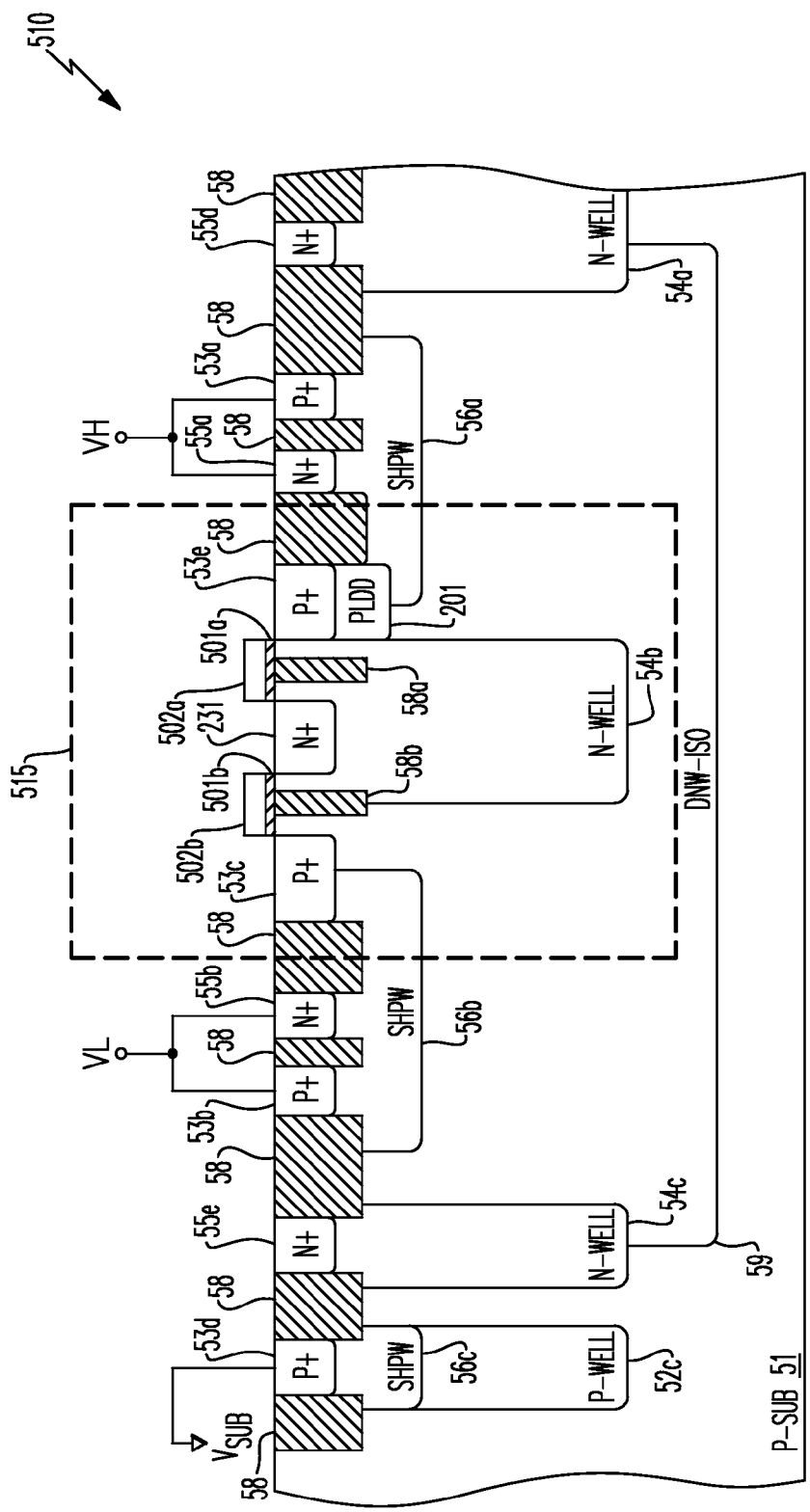

FIG. 8D is a cross-section of a clamp device 510 according to another embodiment. The clamp device 510 of FIG. 8D is similar to the clamp device 500 of FIG. 8C, except that the clamp device 510 includes a different configuration of a blocking voltage tuning structure 515.

The blocking voltage tuning structure 515 of FIG. 8D is similar to the blocking voltage tuning structure 505 of FIG. 8C, except that the blocking voltage tuning structure 515 further includes a first oxide region 58a formed beneath the first conductor 501a and a second oxide region 58b formed beneath the second conductor 501b. Additionally, the second n-well 54b of FIG. 8D includes an edge this aligned with an edge of the fifth P+ active region 53e and the PLDD region 201.

In comparison to the clamp device 500 of FIG. 8C, the clamp device 510 of FIG. 8D can have a shallower deep oxide formation, which in certain embodiments can be based on a specific CMOS or BiCMOS technology minimum feature size, for instance in the range of 0.2 µm to 0.6 µm. Including a deep oxide formation region in the blocking voltage tuning structure can reduce standing leakage as compared with the structure in FIG. 8C, at the cost of reducing device turn-on speed and increasing voltage clamping overshoot. Thus, the option to include the oxide regions can provide device design trade-off for advanced processing technologies where leakage has become more significant.

Additional details of the clamp device 510 can be similar to those described earlier.

Figure 8E:
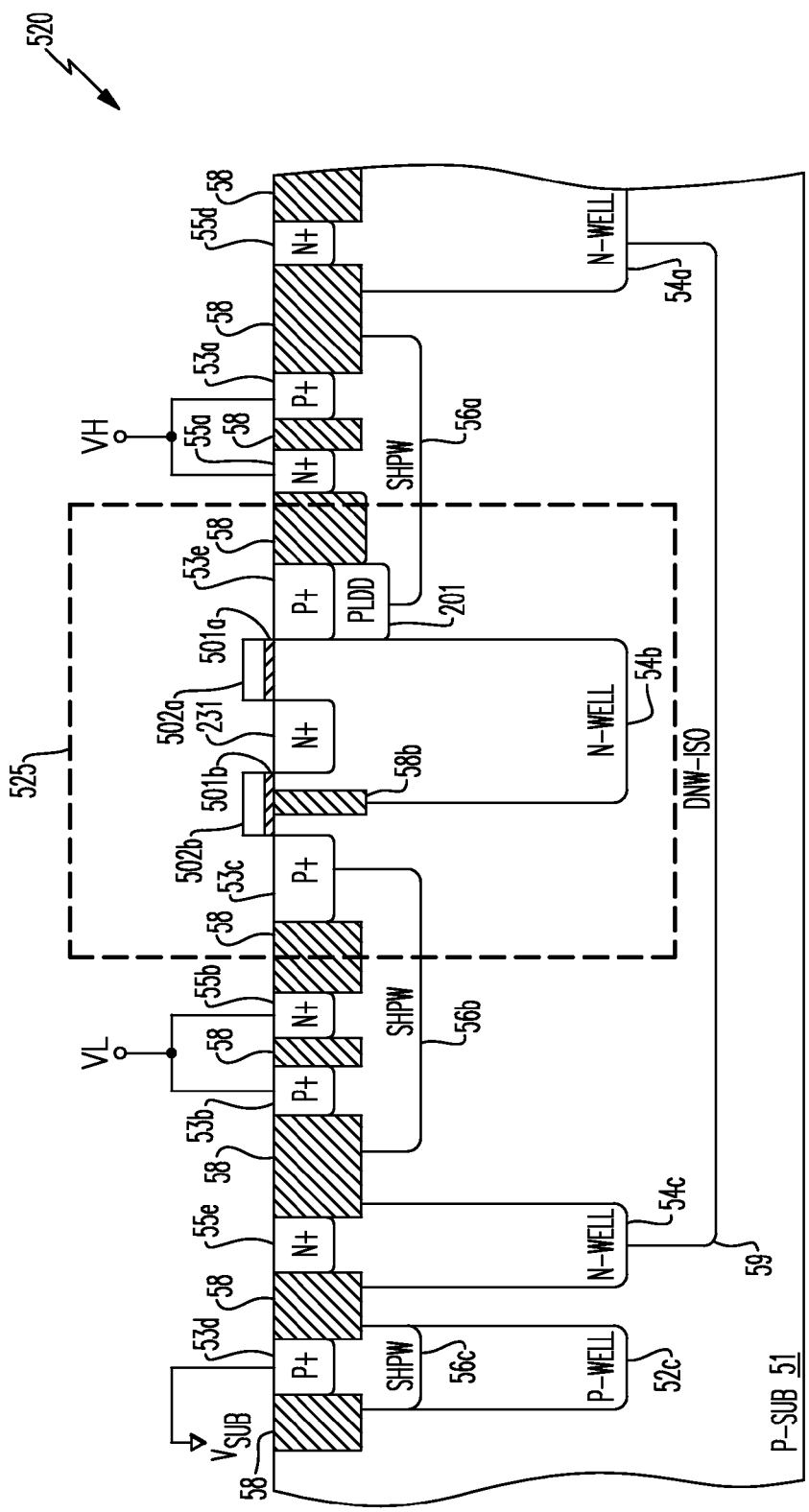

FIG. 8E is a cross-section of a clamp device 520 according to another embodiment. The clamp device 520 of FIG. 8E is similar to the clamp device 510 of FIG. 8D, except that the clamp device 520 includes a different configuration of a blocking voltage tuning structure 525.

The blocking voltage tuning structure 525 of FIG. 8E is similar to the blocking voltage tuning structure 515 of FIG. 8D, except that the blocking voltage tuning structure 525 omits the first oxide region 58a. Omitting the first oxide region 58a (for instance, in sub-180 nm process technologies) can accelerate device clamping function by reducing voltage overshoot during activation. The illustrated configuration can provide a balance or middle point tradeoff between the lower overshoot/higher standing leakage structure in FIG. 8C and the higher overshoot/lower standing leakage current structure of FIG. 8D. By selecting a design that is appropriate for a particular application, a desired device response can be achieved in stringent interface applications for developed in sub-180 nm process technologies.

Additional details of the clamp device 520 can be similar to those described earlier.

Figure 9A:
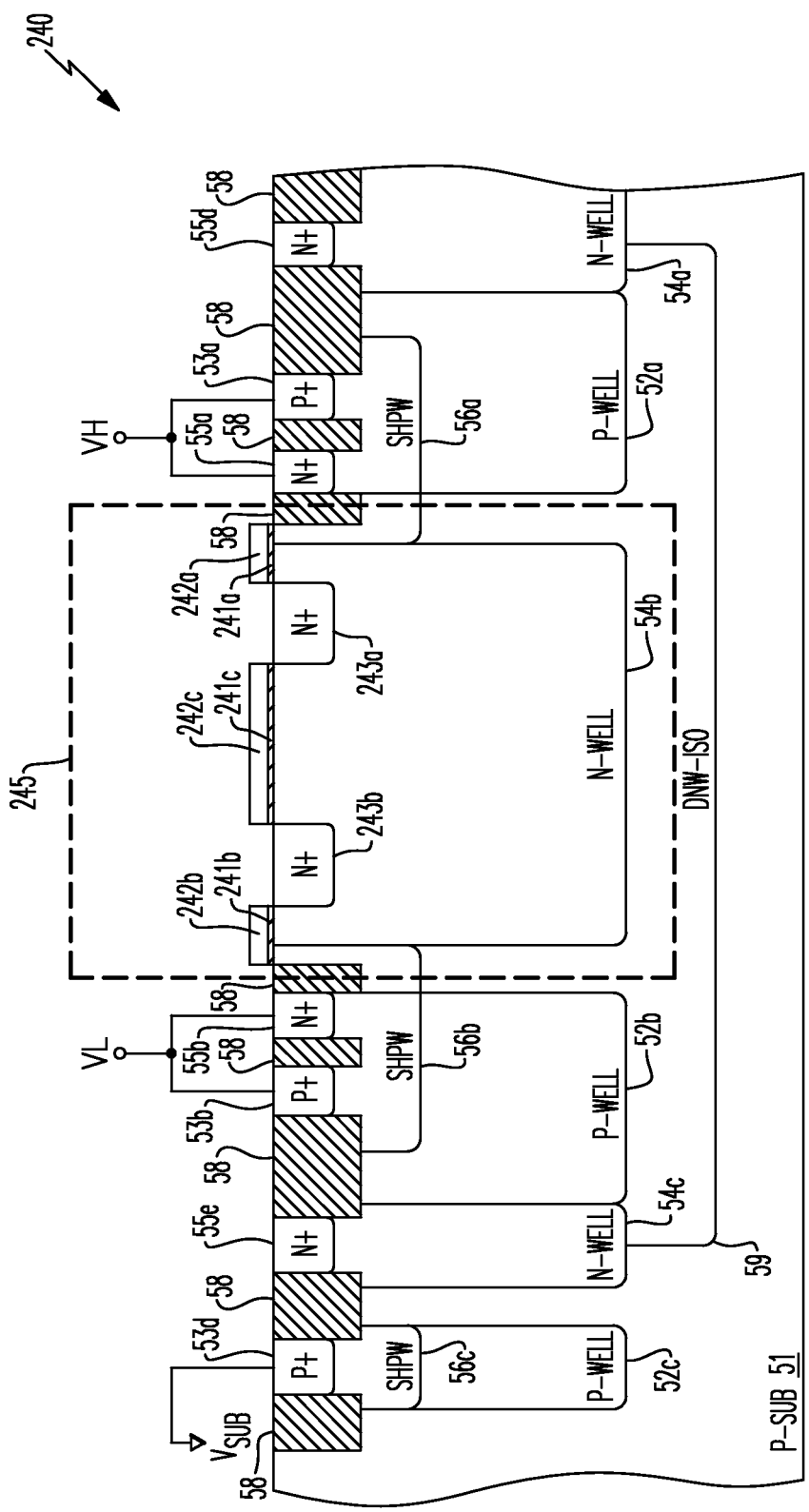
FIGS. 9A-9D are cross-sections of various embodiments of dual-polarity overvoltage clamp devices.

FIG. 9A is a cross-section of a clamp device 240 according to another embodiment. The clamp device 240 of FIG. 9A is similar to the clamp device 100 of FIGS. 3A-3C, except that the clamp device 240 includes a different configuration of p-type well regions and of a blocking voltage tuning structure 245.

For example, in contrast to the first p-type well region of FIGS. 3A-3C in which the first p-well 52a and the first SHPW 56a include sides that are aligned, the illustrated configuration includes an offset between the first p-well 52a and the first SHPW 56a. Additionally, in contrast to the second p-type well region of FIGS. 3A-3C in which the second p-well 52b and the second SHPW 56b include sides that are aligned, the illustrated configuration includes an offset between the second p-well 52b and the second SHPW 56b. A width of the offset between the first p-well 52a and the first SHPW 56a and a width of the offset between the second p-well 52b and the second SHPW 56b can be chosen to provide fine-tuned control of carrier concentrations at blocking junctions associated with the first and second p-type well regions.

The blocking voltage tuning structure 245 includes a second n-well 54b, a first dielectric region 241a, a second dielectric region 241b, a third dielectric region 241c, a first conductor 242a, a second conductor 242b, a third conductor 242c, a first N+ region 243a, and a second N+ region 243b. The first and second N+ regions 243a, 243b are in the second n-well 54b. The third conductor 242c and the third dielectric region 241c extend over a surface of the P-SUB 51 between the first and second N+ regions 243a, 243b. The second n-well 54b is positioned between the first and second SHPWs 56a, 56. The first conductor 242a and the first dielectric region 241a are positioned over a portion of the substrate between a boundary of the second n-well 54b and the first SHPW 56a, and the second conductor 242b and the second dielectric region 241b are positioned over a portion of the substrate between a boundary of the second n-well 54b and the second SHPW 56b.

The first and second conductors 241a, 241b do not operate as gates of FETs in this embodiment, since semiconductor regions of different doping polarities are disposed on opposite sides of the conductors. However, during an overvoltage event, the first and second conductors 241a, 241b may impact the operation of the clamp device 240 by generating inversion layers that impact breakdown voltages of blocking junctions beneath the conductors. This configuration, on the other hand, eliminates the presence of the PMOS transistor 94 shown in FIG. 6B, which lowers leakage at high temperature in precision applications with particularly stringent low leakage design constraints.

Thus, the third conductor 241c does not operate as a gate of a FET in this embodiment, since the semiconductor regions beneath the third conductor 241c and on opposite sides of the third conductor 241c are all n-type. However, during an overvoltage event, the third conductor 241c may impact the operation of the clamp device 240 by facilitating current conduction closer to the semiconductor surface.

Additional details of the clamp device 240 can be similar to those described earlier.

Figure 9B:
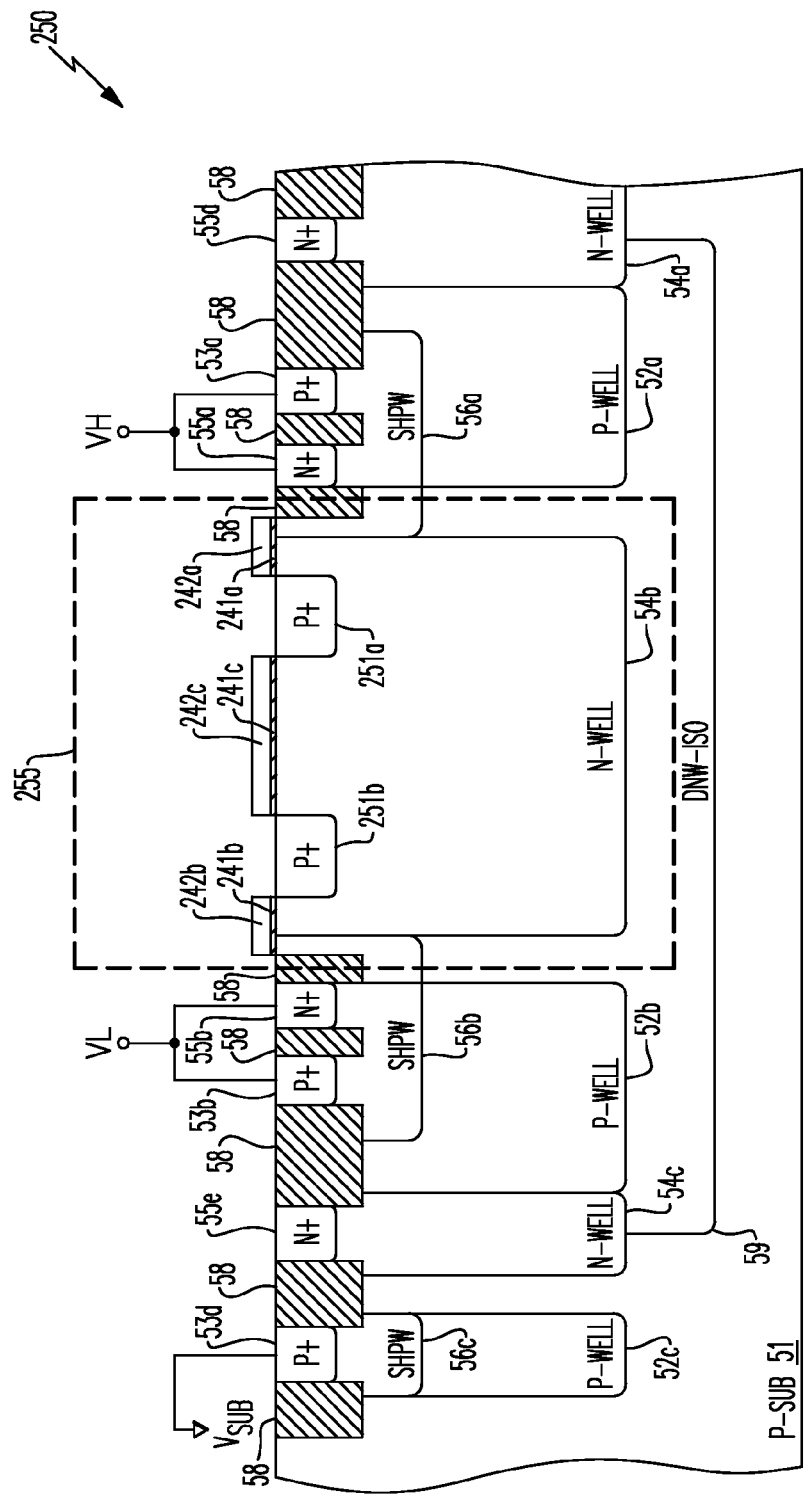

FIG. 9B is a cross-section of a clamp device 250 according to another embodiment. The clamp device 250 of FIG. 9B is similar to the clamp device 240 of FIG. 9A, except that the clamp device 250 includes a different configuration of a blocking voltage tuning structure 255.

The blocking voltage tuning structure 255 of FIG. 9B is similar to the blocking voltage tuning structure 245 of FIG. 9A, except that blocking voltage tuning structure 255 of FIG. 9B includes a first P+ region 251a and a second P+ region 251b instead of the first N+ region 241a and the second N+ region 241b.

Reversing the polarity of these active regions can result in the formation of embedded PFETs. For example, the clamp device 250 includes a first PFET having a source associated with the first SHPW 56a, a drain associated with the first P+ region 251a, a gate associated with the first conductor 252a, and a body associated with the second n-well 54b. Additionally, the clamp device 250 further includes a second PFET having a source associated with the second SHPW 56b, a drain associated with the second P+ region 251b, a gate associated with the second conductor 252b, and a body associated with the second n-well 54b.

The first and second PFETs can increase the turn-on speed of the clamp device 250 of FIG. 9B relative to the clamp device 240 of FIG. 9A. For example, during an overvoltage event, the first and second PFETs can increase the base currents of bipolar transistors that operate in silicon-controlled rectifier structures of the clamp device 250, which can expedite turn-on. However, the first and second PFETs can also increase the leakage current trade-offs.

Additional details of the clamp device 250 can be similar to those described earlier.

Figure 9C:
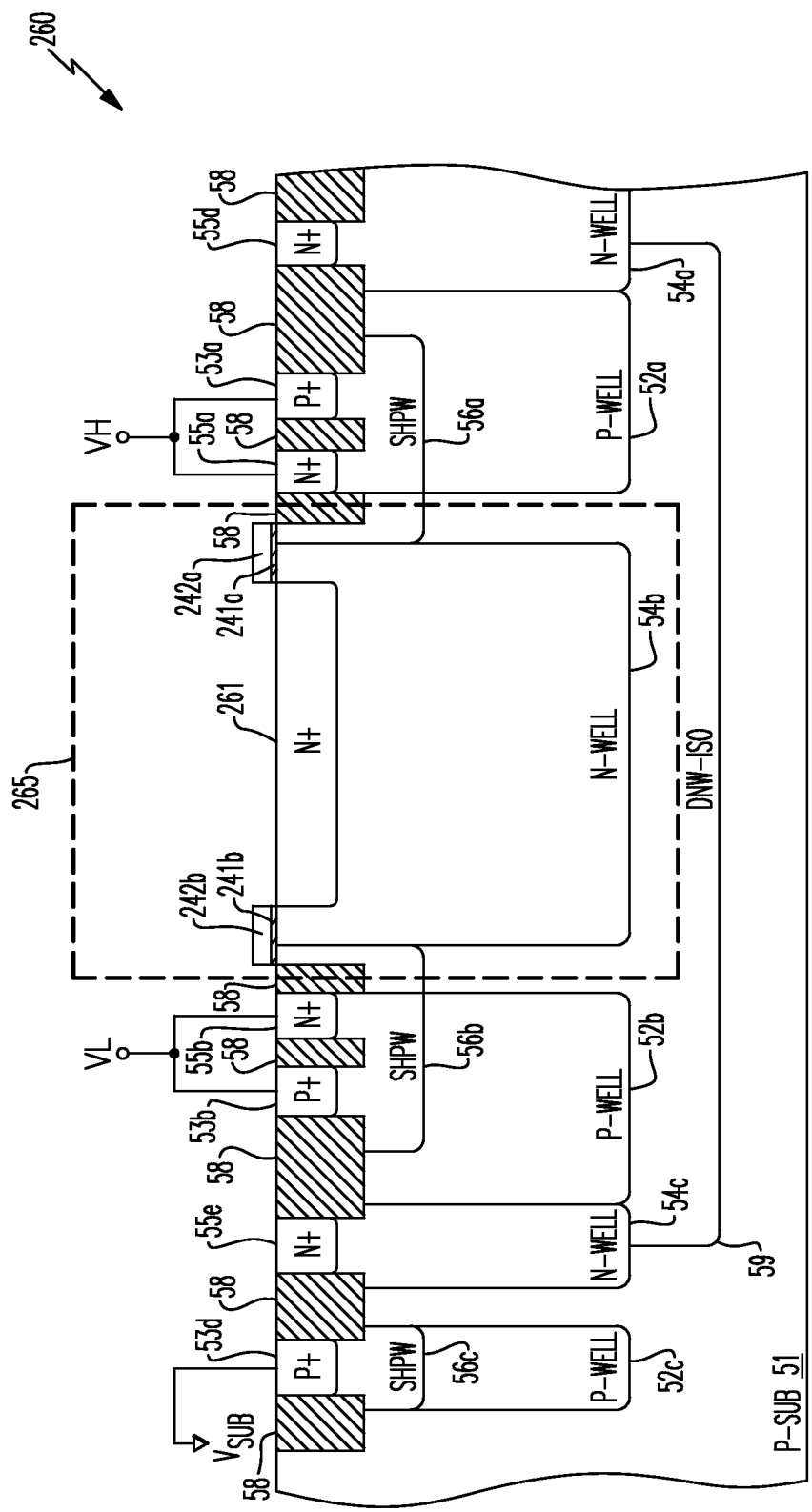

FIG. 9C is a cross-section of a clamp device 260 according to another embodiment. The clamp device 260 of FIG. 9C is similar to the clamp device 240 of FIG. 9A, except that the clamp device 260 includes a different configuration of a blocking voltage tuning structure 265.

For example, in contrast to the blocking voltage tuning structure 245 of FIG. 9A, the blocking voltage tuning structure 265 of FIG. 9C omits the third dielectric region 241c, the third conductor 242c, and the first and second N+ regions 243a, 243b in favor of including an N+ region 261. As shown in FIG. 9C, the N+ region 261 extends over the second n-well 54b between an edge of the first conductor 242a and an edge of the second conductor 242b. In comparison with the clamp device 240 of FIG. 9A, the clamp device 260 of FIG. 9C includes a continuous highly doped region that can increase the effect of external device control, allow for carrier conduction acceleration close to the device's surface, and/or increase net surface doping concentration in the base of the PNP bipolar transistor 93 shown in FIG. 7.

Additional details of the clamp device 260 can be similar to those described earlier.

Figure 9D:
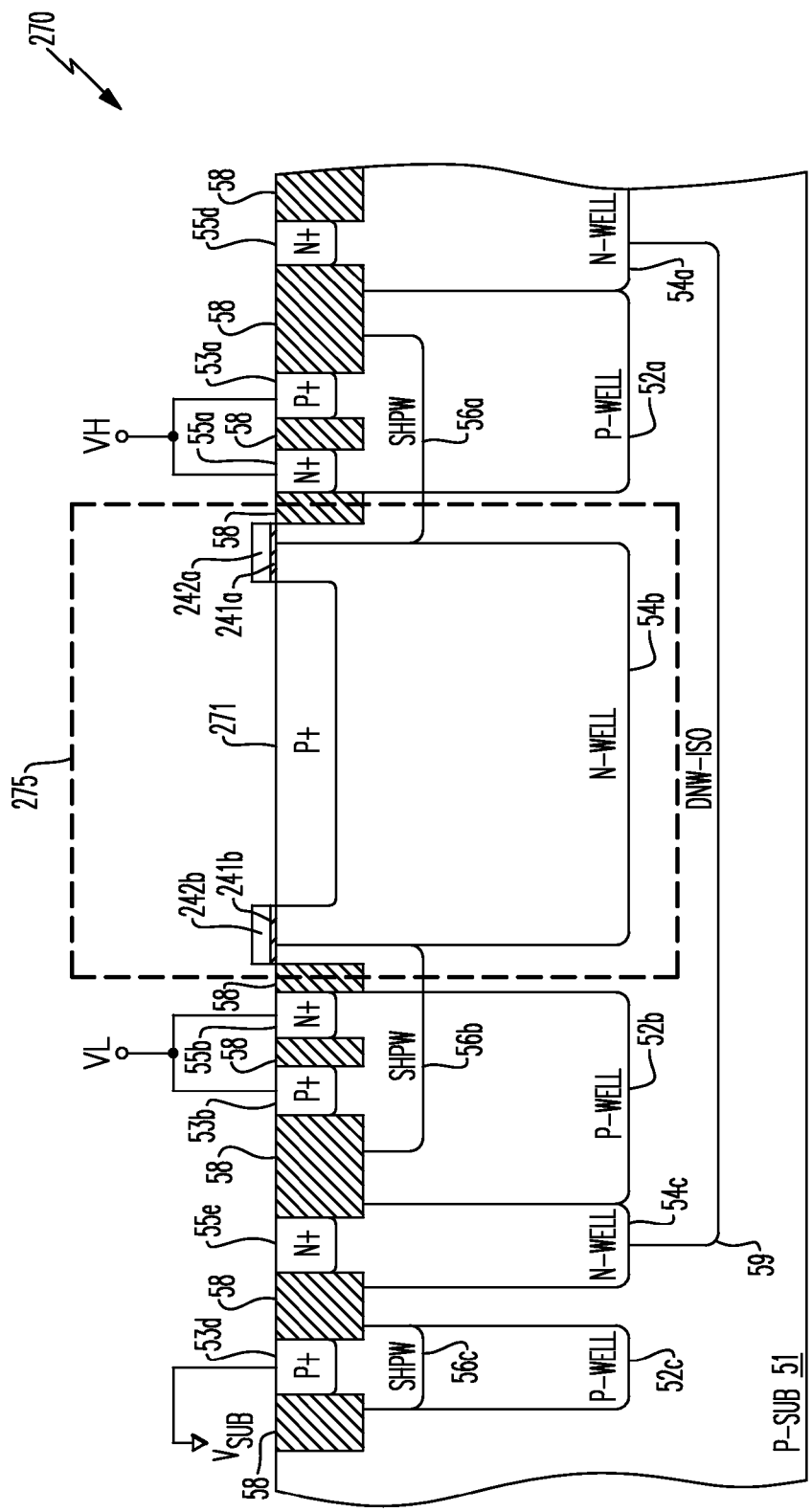

FIG. 9D is a cross-section of a clamp device 270 according to another embodiment. The clamp device 270 of FIG. 9D is similar to the clamp device 250 of FIG. 9B, except that the clamp device 270 includes a different configuration of a blocking voltage tuning structure 275.

For example, in contrast to the blocking voltage tuning structure 255 of FIG. 9B, the blocking voltage tuning structure 275 of FIG. 9D omits the third dielectric region 241c, the third conductor 242c, and the first and second P+ regions 251a, 251b in favor of including a P+ region 271. As shown in FIG. 9D, the P+ region 271 extends over the second n-well 54b between an edge of the first conductor 242a and an edge of the second conductor 242b. In comparison with the clamp device 250 of FIG. 9B, the clamp device 270 of FIG. 9D can have a p-n junction formation that can serve for forming an extra PNP bipolar formation to the center P+ active region 271 that can be externally controlled.

Additional details of the clamp device 270 can be similar to those described earlier.

Figure 10A:
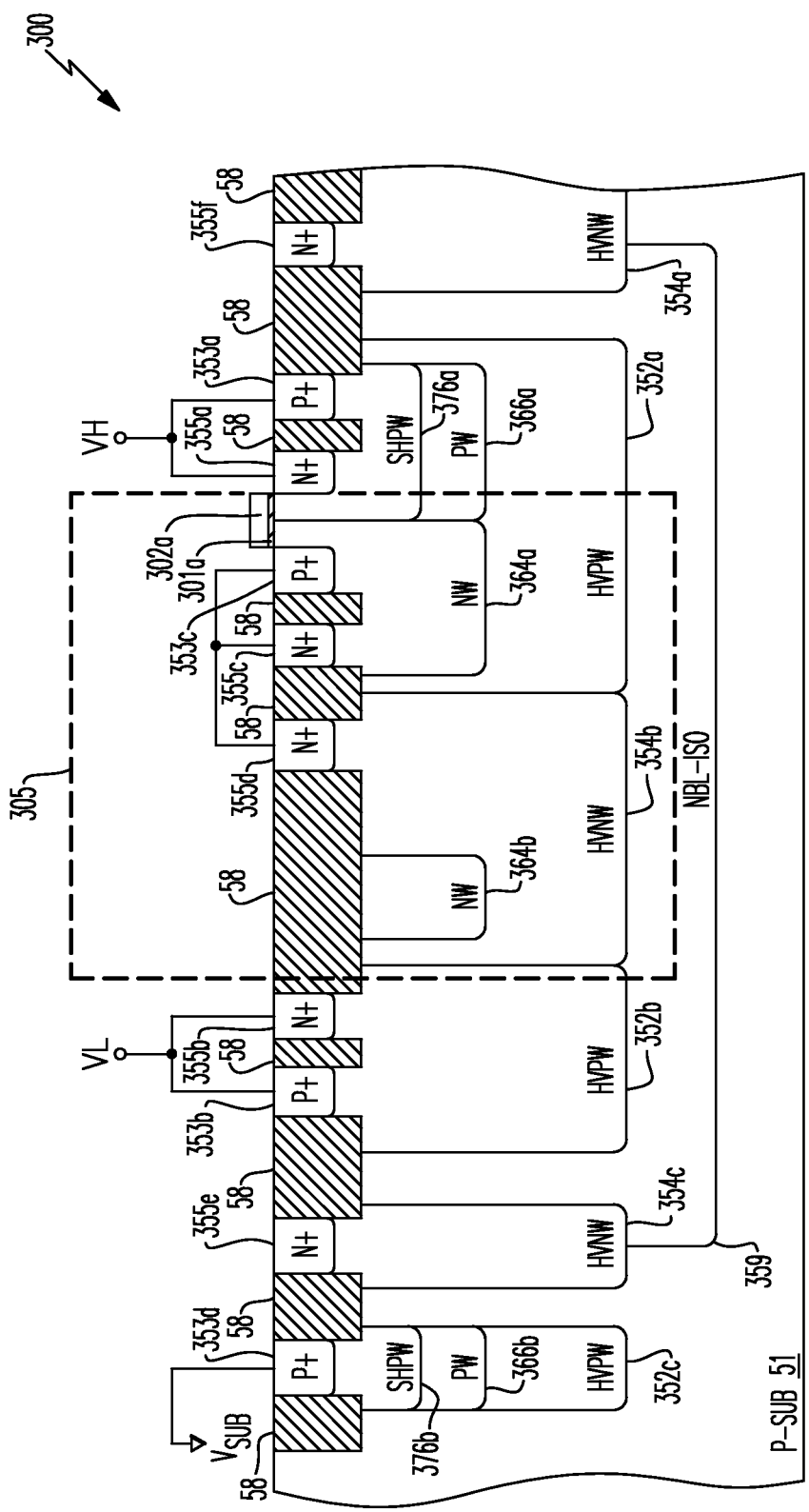
FIG. 10A is a cross-section of a dual-polarity overvoltage clamp device according to another embodiment.
Figure 10B:
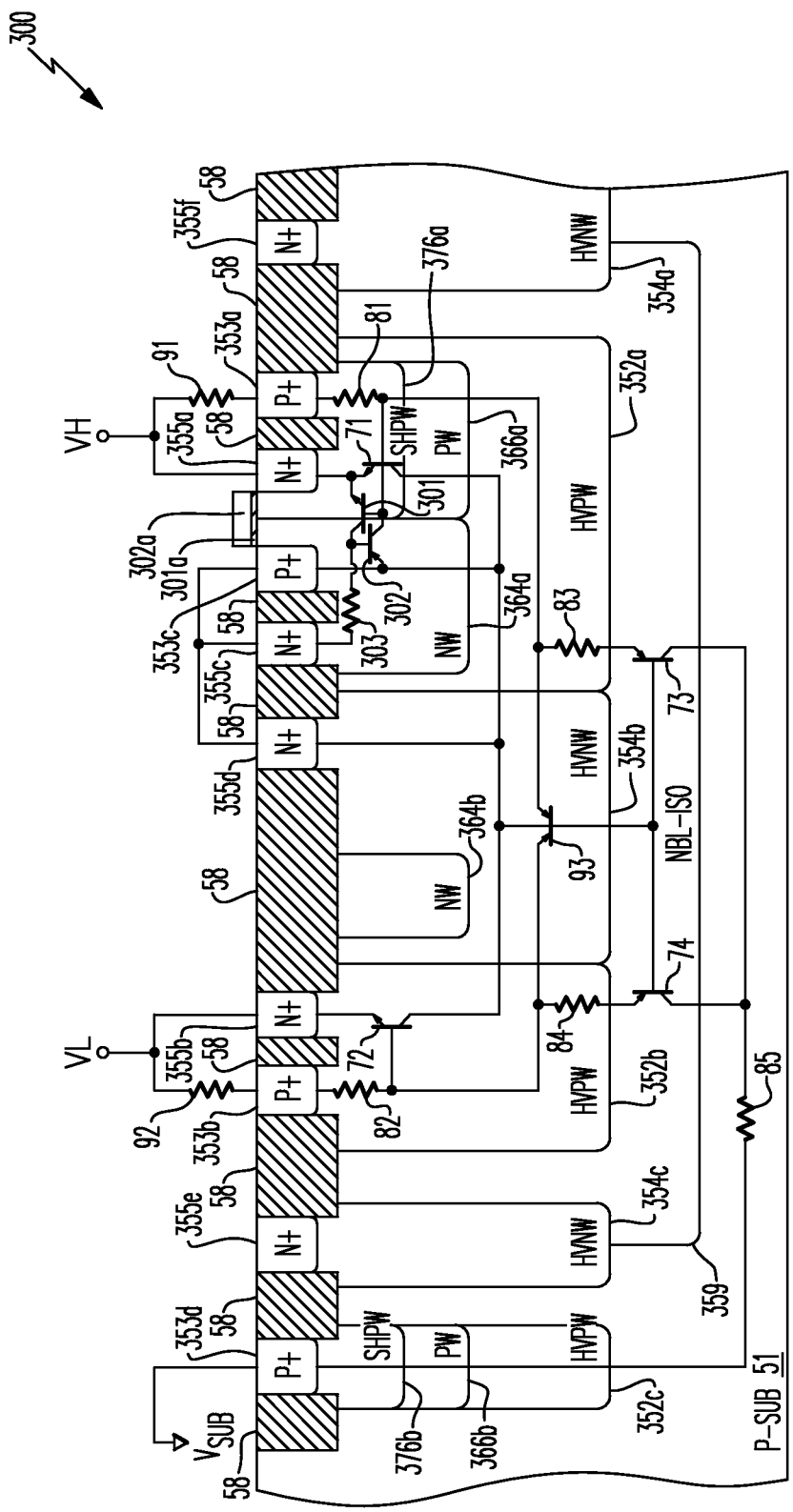
FIG. 10B is an annotated version of the cross-section of FIG. 10A showing certain circuit devices.

FIG. 10A is a cross-section of a clamp device 300 according to another embodiment. Additionally, FIG. 10B is an annotated version of the cross-section of FIG. 10A showing certain circuit devices.

The clamp device 300 is fabricated in the P-SUB 51, and includes oxide regions 58, a first high voltage p-type well (HVPW) 352a, a second HVPW 352b, a third HVPW 352c, a first high voltage n-type well (HVNW) 354a, a second HVNW 354b, a third HVNW 354c, an n-type buried layer isolation (NBL-ISO) region 359, a first p-well 366a, a second p-well 366b, a first n-well 364a, a second n-well 364b, a first SHPW 376a, a second SHPW 376b, a first dielectric region 301a, a first conductor 302a, a first P+ region 353a, a second P+ region 353b, a third P+ region 353c, a fourth P+ region 353d, a first N+ region 355a, a second N+ region 355b, a third N+ region 355c, a fourth N+ region 355d, a fifth N+ region 355e, and a sixth N+ region 355f. The clamp device 300 further includes a first terminal VH, a second terminal VL, and a substrate terminal that is electrically connected to a substrate voltage $V_{SUB}$.

In the illustrated embodiment, the first HVPW 352a, the first p-well 366a, and the first SHPW 376a collectively operate as a first p-type well region, and the second HVPW 352b operates as a second p-type well region. The first P+ region 353a and the first N+ region 355a are disposed in the first p-type well region, and the second P+ region 353b and the second N+ region 355b are disposed in the second p-type well region. Although a particular configuration of p-type well regions is shown, the first and/or second p-type well regions can include a different combination of well structures selected to achieve a desired geometry, doping concentration, and/or doping profile. For example, in certain configurations, a p-type well region can include one or more of a HVPW, a p-well, or a SHPW.

In certain configurations, the HVPWs can have a deeper depth than p-wells, SHPWs, and P+ regions, but a peak p-type doping concentration that is less than that of the p-wells, SHPWs, and P+ regions. Additionally, the p-wells can have a deeper depth than SHPWs and P+ regions, but a peak p-type doping concentration that is less than that of the SHPWs, and P+ regions. Furthermore, the SHPWs can have a deeper depth than the P+ regions, but a peak p-type doping concentration that is less than that of the P+ regions.

As shown in FIGS. 10A-10B, the NBL-ISO region 359 extends beneath the first HVPW 352a, beneath the second HVPW 352b, beneath the second HVNW 354b, beneath a portion of the first HVNW 354a, and beneath a portion of the third HVNW 354c. In the illustrated configuration, the NBL-ISO region 359, and the first and third HVNWs 354a, 354c operate as an n-type isolation structure that electrically isolates the first p-type well region and the second p-type well region from the P-SUB 51. Although FIG. 10A-10B illustrates one configuration of an n-type isolation structure, other configurations are possible.

In the illustrated embodiment, the n-type isolation structure is configured to be electrically floating, which can aid in expanding a range of voltages over which the clamp device's terminals can operate. The fifth N+ region 355e is disposed in the third HVNW 354c, and the sixth N+ region 355f is disposed in the first HVNW 354a, but do not have a voltage controlled externally in this embodiment.

In the illustrated configuration, the clamp device 300 is formed directly in the P-SUB 51. However, the teachings herein are also applicable to configurations in which the clamp device 300 is fabricated in a p-type region of a substrate, such as in a p-type epitaxial layer that is on a doped or undoped support substrate.

The third HVPW 352c, the second p-well 366b, the second SHPW 376b, and the fourth P+ region 353d operate as a guard ring of the clamp device 300. The guard ring can eliminate formation of unintended parasitic paths between the clamp device 300 and surrounding semiconductor components when integrated on-chip. In the illustrated configuration, the guard ring is spaced from the n-type isolation structure to enhance latch-up immunity by reducing the injection of carriers into the P-SUB 51. As shown in FIGS. 10A-10B, the guard ring is electrically connected to the substrate voltage $V_{SUB}$.

As shown in FIGS. 10A-10B, the first terminal VH of the clamp device 300 is electrically connected to the first P+ region 353a and to the first N+ region 355a. Additionally, the second terminal VL of the clamp device 300 is electrically connected to the second P+ region 353b and to the second N+ region 355b.

The cross-section of FIG. 10B has been annotated to show certain circuit devices of the clamp device 300, including a first resistor 81, a second resistor 82, a third resistor 83, a fourth resistor 84, a fifth resistor 85, a first NPN bipolar transistor 71, a second NPN bipolar transistor 72, a first PNP bipolar transistor 73, a second PNP bipolar transistor 74, a first external resistor 91, a second external resistor 92, and a bidirectional PNP bipolar transistor 93, which can be similar to those described earlier. The cross-section of FIG. 10B further illustrates a junction-bypass NPN bipolar transistor 301, a junction-bypass PNP bipolar transistor 302, and a junction-bypass resistor 303.

As shown in FIG. 10A, the clamp device 300 includes a blocking voltage tuning structure 305, which is positioned between the first N+ region 355a and the second N+ region 355b. The blocking voltage tuning structure 305 can be implemented to provide a desired protection characteristic between the first and second terminals VH, VL, such as a desired forward trigger voltage, forward holding voltage, reverse trigger voltage, and/or reverse holding voltage.

In the illustrated configuration, the second HVNW 354b is positioned between the first and second HVPWs 352a, 352b. Additionally, the first n-well 364a is in the first HVPW 352a adjacent the first p-well 366a, and the second n-well 364b is in the second HVNW 354b. Furthermore, the third P+ region 353c and the third N+ region 355c are in the first n-well 364a, and the fourth N+ region 355d is in the second HVNW 354b. Additionally, the first dielectric region 301a and the first conductor 302a are positioned over a boundary between the first p-well 366a and the first n-well 364a, and extend between the first N+ region 355a and the first P+ region 353c.

The blocking voltage tuning structure 305 includes a first blocking junction associated with the interface between the first HVPW 352a and the second HVNW 354b, which corresponds to a base-to-collector junction of the first NPN bipolar transistor 71. Additionally, the blocking voltage tuning structure 305 includes a second blocking junction associated with the interface between the second HVPW 352b and the second HVNW 354b.

As shown in FIGS. 10A-10B, the blocking voltage tuning structure 305 includes an SCR structure used to bypass the first blocking junction. In particular, the third P+ region 353c, the first n-well 364a, the first p-well 366a, and the first N+ region 355a operate as a PNPN silicon controlled rectifier (SCR) structure that is used to control the clamp device's reverse trigger and reverse holding voltages between the first and second terminals VH, VL. Thus, rather than having a reverse protection characteristic defined by the first blocking junction between the first HVPW 352a and the second HVNW 354b, the clamp device 300 includes an SCR structured used to bypass the first blocking junction.

Configuring the clamp device 300 in this manner can provide fine-tuned control over forward and reverse protection characteristics, even when the desired magnitude of the forward trigger voltage and the desired magnitude of the reverse trigger voltage differ greatly. For example, the illustrated configuration can be used to provide a forward trigger voltage that is relatively high, for example in the range of 40 V to 100 V, for instance 70 V, and a reverse trigger voltage that is relatively low, for example in the range of −3 V to −20 V, for instance −10 V.

The SCR structure used to bypass the first blocking junction includes the junction-bypass NPN bipolar transistor 301 and the junction-bypass PNP bipolar transistor 302, which are cross-coupled with another to provide a PNPN SCR structure. The illustrated configuration includes the first dielectric region 301a and the first conductor 302a, which can impact operation of the PNPN SCR structure by expediting the low trigger voltage in the PNPN SCR structure. However, other configurations are possible, such as implementations in which the first dielectric region 301a and the first conductor 302a are omitted in favor of using an oxide region and/or implementations including a combination of oxide regions and conductor/dielectric structures.

As shown in FIGS. 10A-10B, the third P+ region 353c is electrically connected to the fourth N+ region 355d, which can provide an electrical path between the emitter of the junction-bypass PNP bipolar transistor 302 and the second HVNW 354b, thereby providing a bypass path to the blocking junction between the first HVPW 352a and the second HVNW 354b. The annotated electrical connections can be made using metallization.

In the illustrated configuration, the third P+ region 353c is also electrically connected to the third N+ region 355c. Electrically connecting the third P+ region 353c and the third N+ region 355c can aid in achieving a desired resistance across the base-to-emitter junction of the junction-bypass PNP bipolar transistor 302, which can provide fine-tuned control over the PNPN SCR structure. However, other configurations are possible, such as implementations in which the third P+ region 353c and the third N+ region 355c are electrically disconnected or implementations in which an external resistor is included in series with the junction-bypass resistor 303 to increase base-to-emitter resistance.

The illustrated configuration includes the second n-well 364b, which is positioned near the clamp device's second blocking junction associated with the interface between the second HVPW 352b and the second HVNW 354b. The second n-well 364b can increase a concentration of electrons near the clamp device's second blocking junction, which can decrease the blocking junction's blocking voltage. FIG. 10B illustrates one example of the second blocking junction, but other configurations are possible. For example, various combinations of well regions, active regions, and native implants can be combined to achieve a blocking junction of a desired geometry, doping concentration, and/or doping profile.

Figure 11:
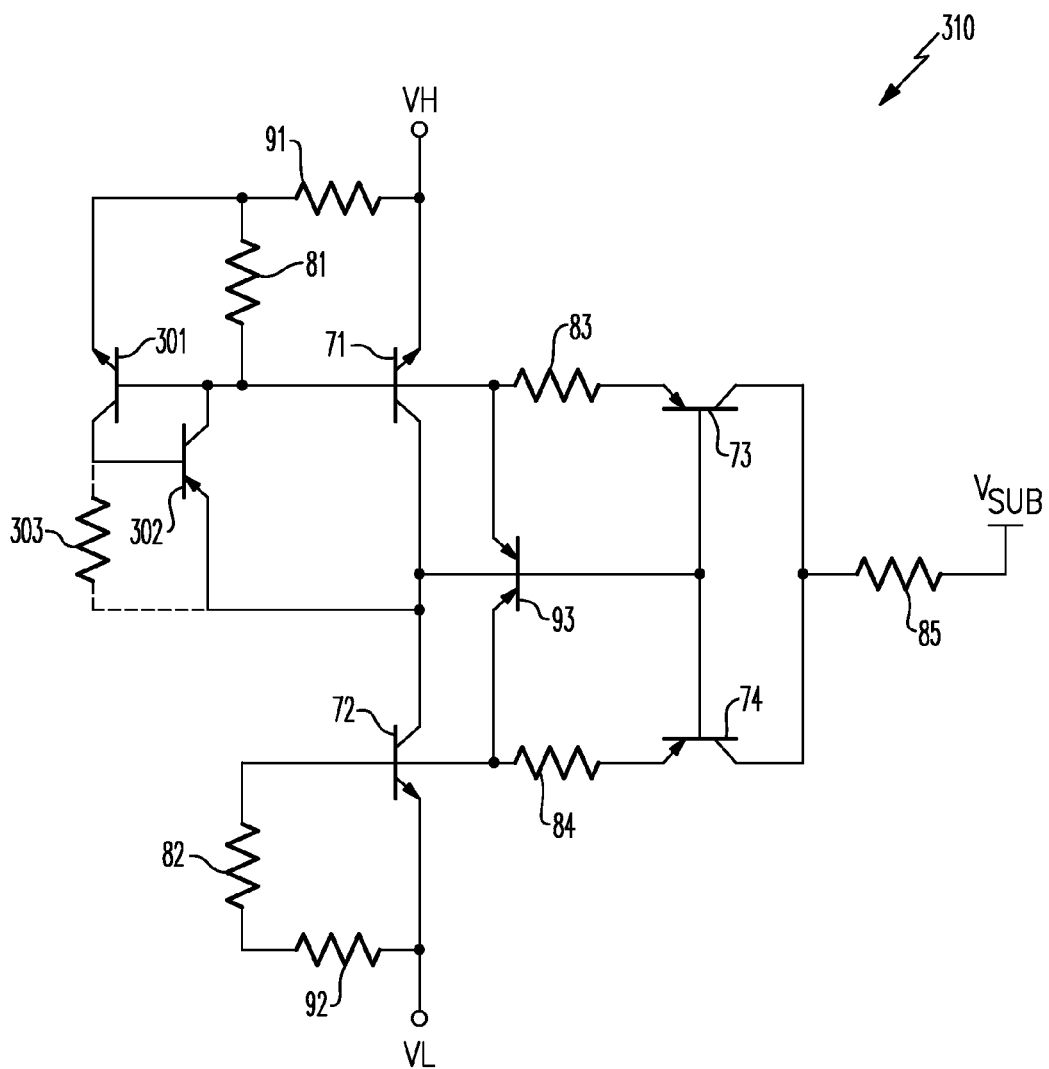
FIG. 11 shows a circuit diagram of the dual-polarity overvoltage clamp device of FIGS. 10A-10B.

FIG. 11 shows a circuit diagram 310 of the clamp device 300 of FIGS. 10A-10B. The circuit diagram 110 includes the first resistor 81, the second resistor 82, the third resistor 83, the fourth resistor 84, the fifth resistor 85, the first NPN bipolar transistor 71, the second NPN bipolar transistor 72, the first PNP bipolar transistor 73, the second PNP bipolar transistor 74, the first external resistor 91, the second external resistor 92, the bidirectional PNP bipolar transistor 93, the junction-bypass NPN bipolar transistor 301, the junction-bypass PNP bipolar transistor 302, and the junction-bypass resistor 303. Electrical connections between the circuit components and the first terminal VH, the second terminal VL, and the substrate voltage $V_{SUB}$ have been illustrated.

The PNP bidirectional bipolar transistor 93 and the first NPN bipolar transistor 71 are cross-coupled, and operate as a first SCR between the first terminal VH and the second terminal VL. Additionally, the PNP bidirectional bipolar transistor 93 and the second NPN bipolar transistor 72 are cross-coupled, and operate as a second SCR.

In contrast to the configuration shown in FIG. 7 in which the first SCR controls the clamp device's reverse trigger and holding voltages, the illustrated configuration includes bypass transistors used to control reverse trigger and holding voltages. For example, the junction-bypass NPN bipolar transistor 301 and the junction-bypass PNP bipolar transistor 302 are arranged as a third SCR that is used to bypass the base-to-collector junction of the NPN bipolar transistor 71.

Accordingly, the clamp device 300 can have reverse trigger and holding voltages controlled by the third SCR. The reverse trigger and holding voltages can be tuned by controlling the gain and conduction strength of the junction-bypass PNP bipolar transistor 302 relative to the gain and conduction strength of the junction-bypass NPN bipolar transistor 301. Additionally, the reverse trigger and holding voltages can be controlled in part by selecting the resistance of the junction-bypass resistor 303 and/or controlling the electrical connectivity between the base and emitter of the junction-bypass PNP bipolar transistor 302.

The size, spacing, and doping concentrations of active regions and wells associated with the junction-bypass PNP bipolar transistor 302 and the junction-bypass NPN bipolar transistor 301 can be selected to provide fine-tuned control of the trigger and holding voltage characteristics to enable the clamp device 300 to be implemented to achieve performance specifications associated with a particular application and/or manufacturing process.

Additional details of the clamp device 300 can be similar to those described earlier.

Figure 12A:
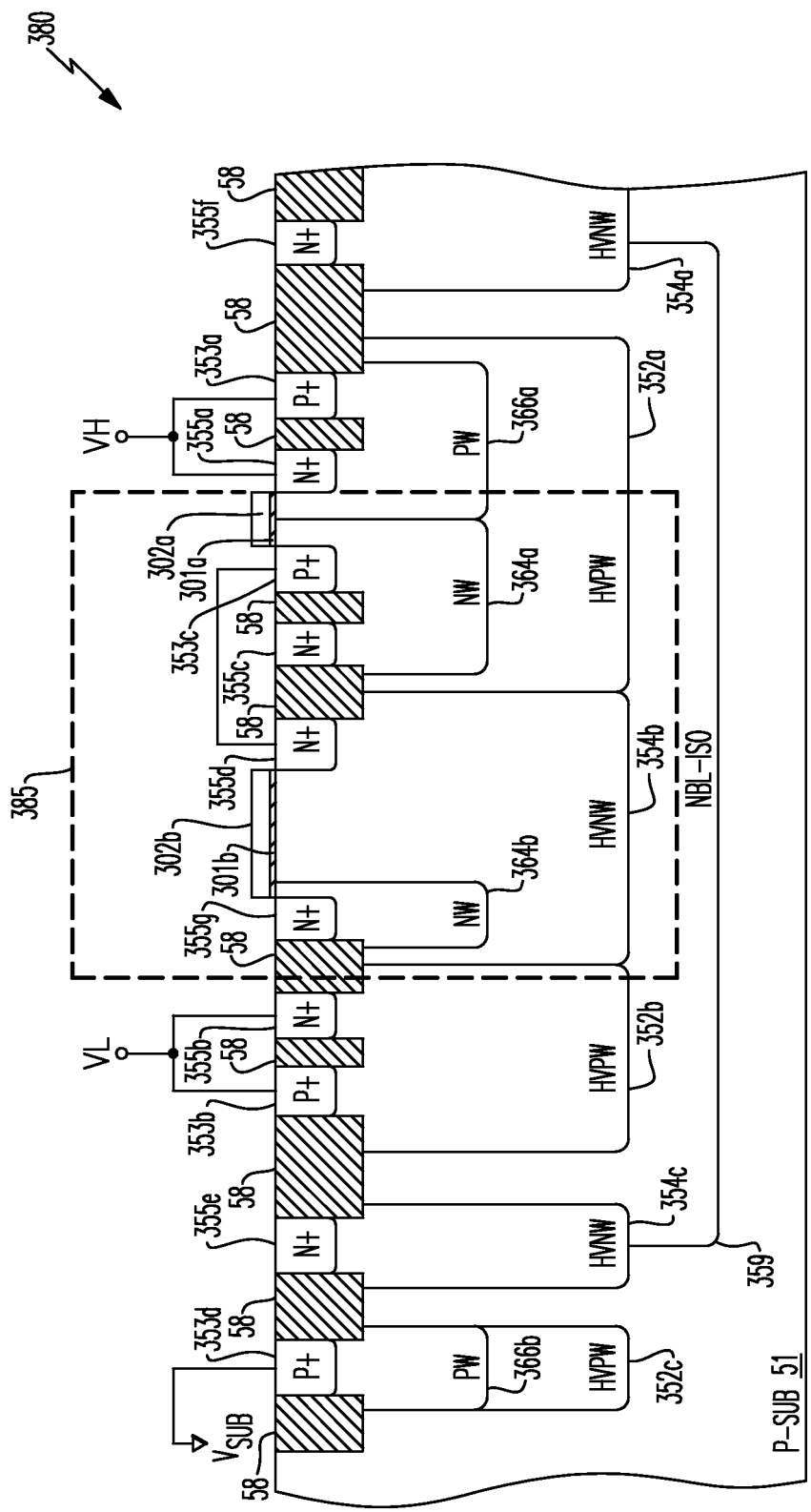
FIGS. 12A-12C are cross-sections of various embodiments of dual-polarity overvoltage clamp devices.

FIG. 12A is a cross-section of a clamp device 380 according to another embodiment. The clamp device 380 of FIG. 12A is similar to the clamp device 300 of FIGS. 10A-10B, except that the clamp device 380 includes a different configuration of a first p-type well region and of a blocking voltage tuning structure 385.

For example, in contrast to the first p-type well region of FIGS. 10A-10B which includes the first HVPW 352a, the first p-well 366a, and the first SHPW 376a, the illustrated first p-type well region only includes the first HVPW 352a and the first p-well 366a. Omitting the first SHPW 376a can decrease local p-type carrier concentration to provide fine-tuned control over the PNPN SCR associated with the junction-bypass NPN bipolar transistor 301 and the junction-bypass PNP bipolar transistor 302.

Additionally, in contrast to the blocking voltage tuning structure 305 of FIG. 10A, the blocking voltage tuning structure 385 of FIG. 12A omits the electrical connection between the third P+ region 353c and the third N+ region 355c via metallization. Configuring the clamp device 380 can decrease the blocking voltage of the PNPN SCR associated with the junction-bypass NPN bipolar transistor 301 and the junction-bypass PNP bipolar transistor 302.

Furthermore, in contrast to the blocking voltage tuning structure 305 of FIG. 10A, the blocking voltage tuning structure 385 of FIG. 12A further includes a seventh N+ region 355g, a second dielectric region 301b, and a second conductor 302b. As shown in FIG. 12A, the seventh N+ region 355g is in the second n-well 364b, and second dielectric region 301b and the conductor 302b extends over the second HVNW 354b between the fourth N+ region 355d and the seventh N+ region 355g. Configuring the clamp device 380 to include these structures accelerate device turn-on response by accelerating conduction close to the semiconductor surface.

Additional details of the clamp device 380 can be similar to those described earlier.

Figure 12B:
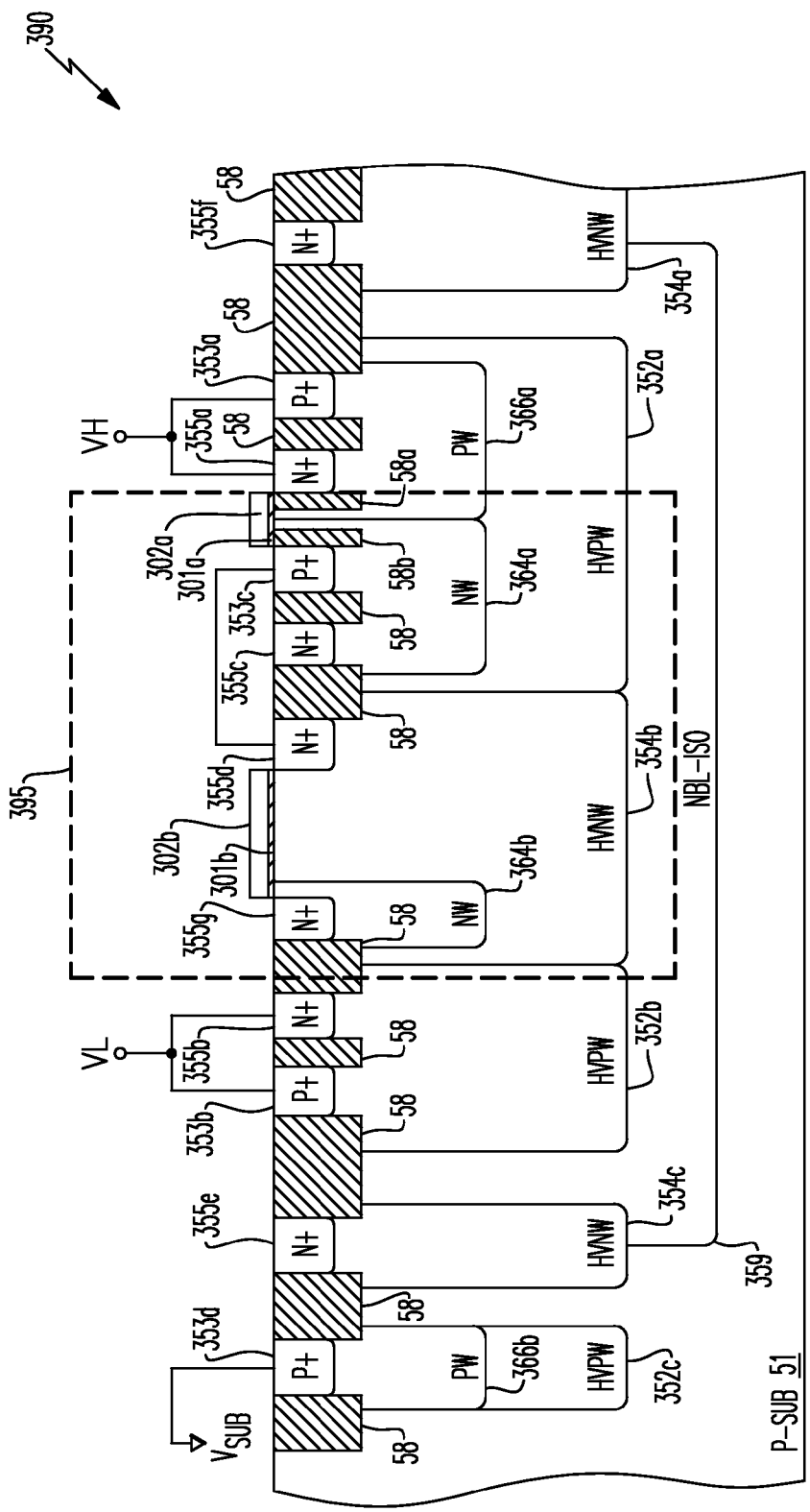

FIG. 12B is a cross-section of a clamp device 390 according to another embodiment. The clamp device 390 of FIG. 12B is similar to the clamp device 380 of FIG. 12A, except that the clamp device 390 includes a different configuration of a blocking voltage tuning structure 395.

For example, in contrast to the blocking voltage tuning structure 385 of FIG. 12A, the blocking voltage tuning structure 395 of FIG. 12B includes a first oxide region 58a adjacent the first N+ region 355a beneath the first conductor 302a and a second oxide region 58b adjacent the third P+ region 353c beneath the first conductor 302a. The first and second oxide regions can be used to control the impact of the first conductor 302a on operation of the SCR associated with the junction-bypass NPN bipolar transistor 301 and the junction-bypass PNP bipolar transistor 302. For example, increasing the width of the first and/or second oxide regions 58a, 58b can reduce the impact of the first conductor 302a on the SCR's operation.

Additional details of the clamp device 390 can be similar to those described earlier.

Figure 12C:
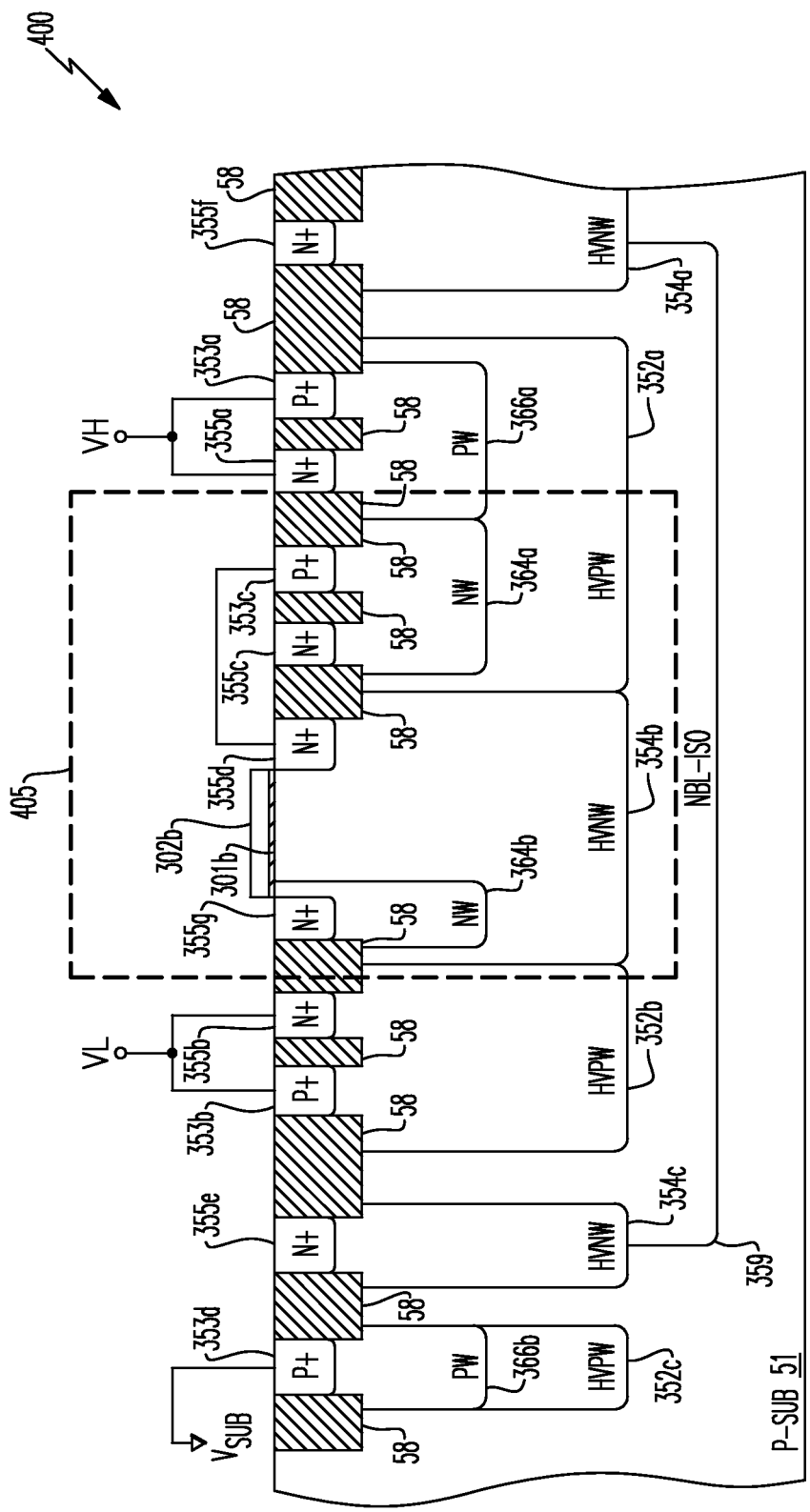

FIG. 12C is a cross-section of a clamp device 400 according to another embodiment. The clamp device 400 of FIG. 12C is similar to the clamp device 380 of FIG. 12A, except that the clamp device 400 includes a different configuration of a blocking voltage tuning structure 405.

For example, in contrast to the blocking voltage tuning structure 385 of FIG. 12A, the blocking voltage tuning structure 405 of FIG. 12A omits the first conductor 301a and the first dielectric region 302a in favor of including an oxide region 58 that extends between the third P+ region 353c and the first N+ region 355a.

Additional details of the clamp device 400 can be similar to those described earlier.

Figure 13A:
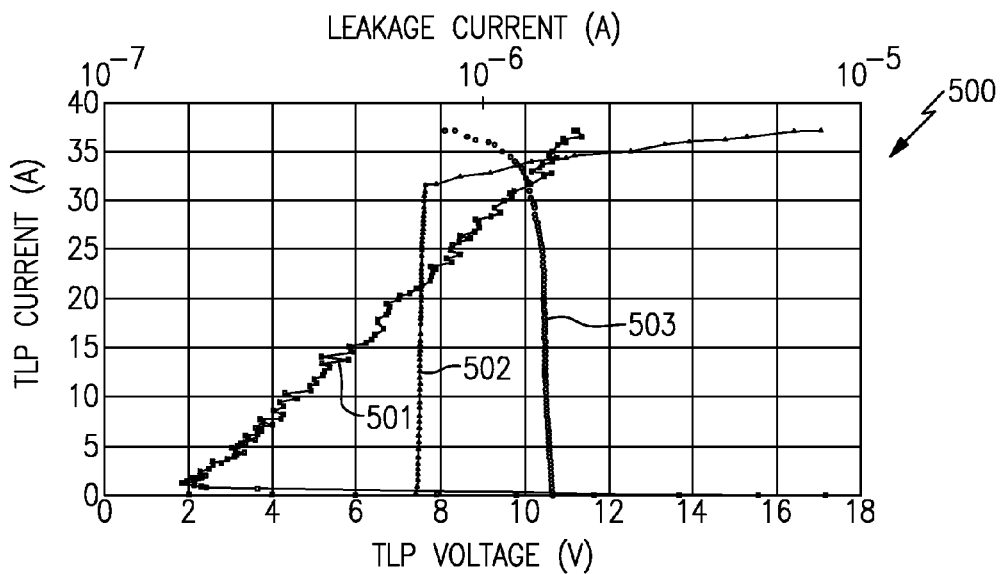
FIGS. 13A-13B are graphs of laboratory data showing forward and reverse dual-polarity overvoltage clamp characteristics according to one embodiment.
Figure 13B:
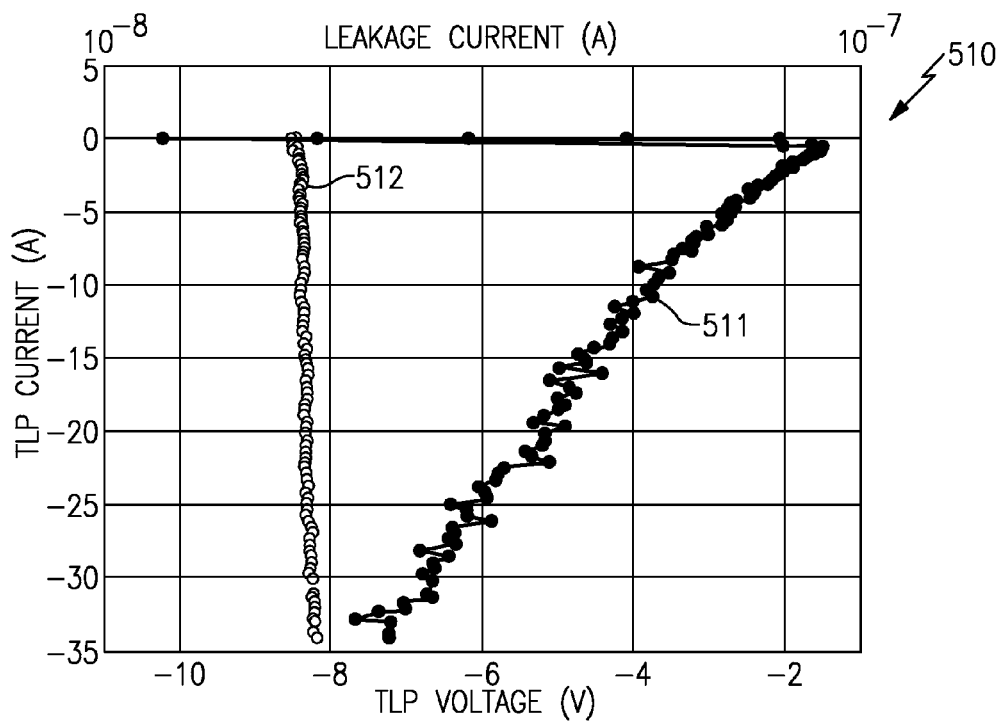

FIGS. 13A-13B are graphs of laboratory data showing forward and reverse protection characteristics according to one embodiment. The measurement data corresponds to one implementation of the clamp device 130 of FIG. 5C. Although FIGS. 13A-13B illustrate laboratory data for one implementation of the clamp device 130, other results are possible, such as data associated with different manufacturing processes, device geometries, and/or doping concentrations.

FIG. 13A is a graph 500 of transmission-line pulse (TLP) laboratory data for a positive transient electrical event. The graph 500 includes a first plot 501 for TLP voltage versus TLP current, a second plot 502 of leakage current at about 15 V, and a third plot 503 of leakage current at about −9.5 V.

Each TLP measurement point can correspond to a voltage and a current measurement obtained by forcing a rectangular 100 ns current pulse having about a 300 ps rise time into the clamp device and measuring the voltage of the clamp device between about 30% and about 90% of the current pulse width.

The second plot 502 of leakage current corresponds to DC leakage at about 15 V after each TLP current pulse. Additionally, the third plot 503 of leakage current corresponds to DC leakage at about −9.5 V after each TLP current pulse. The leakage measurements were taken at about 125° C. high temperature. As skilled artisans will appreciate, a relatively small variation in the leakage current value after each pulse can indicate the integrity of the IC, in this example beyond 30 Amps. In contrast, drastic change in the leakage current can indicate IC damage.

As shown in FIG. 13A, the clamp device can have a forward trigger voltage of about 16 V and a forward holding voltage of about 2 V. Additionally, the leakage current of the clamp device can be below about 1 µA at voltages as high as 15 V. Thus, the leakage current of the clamp device and standing power dissipation can be relatively low and extend the battery lifetime in portable applications, and can have a relatively small variation across TLP current. This can indicate the integrity and robustness of the IC using the clamp device after passage of transient electrical events.

FIG. 13B is a graph 510 of TLP laboratory data for a negative transient electrical event. The graph 510 includes a first plot 511 for TLP voltage versus TLP current and a second plot 512 of leakage current at about −10.5 V. The measurements were taken under conditions similar to those described above with reference to FIG. 13A.

As shown in FIG. 13B, the clamp device can have a reverse trigger voltage of about −11 V and a reverse holding voltage of about −1.5 V. Additionally, the leakage current of the clamp device can be below about 1 µA at voltages as high as 10 V.

Figure 14A:
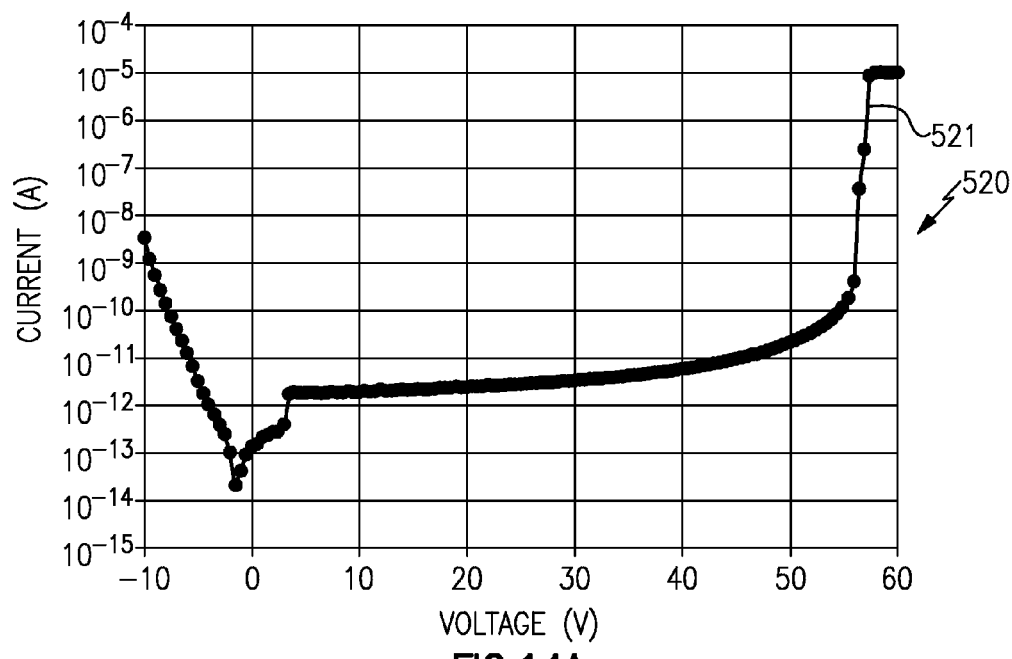
FIGS. 14A-14B are graphs of laboratory data showing substrate breakdown characteristics according to one embodiment.
Figure 14B:
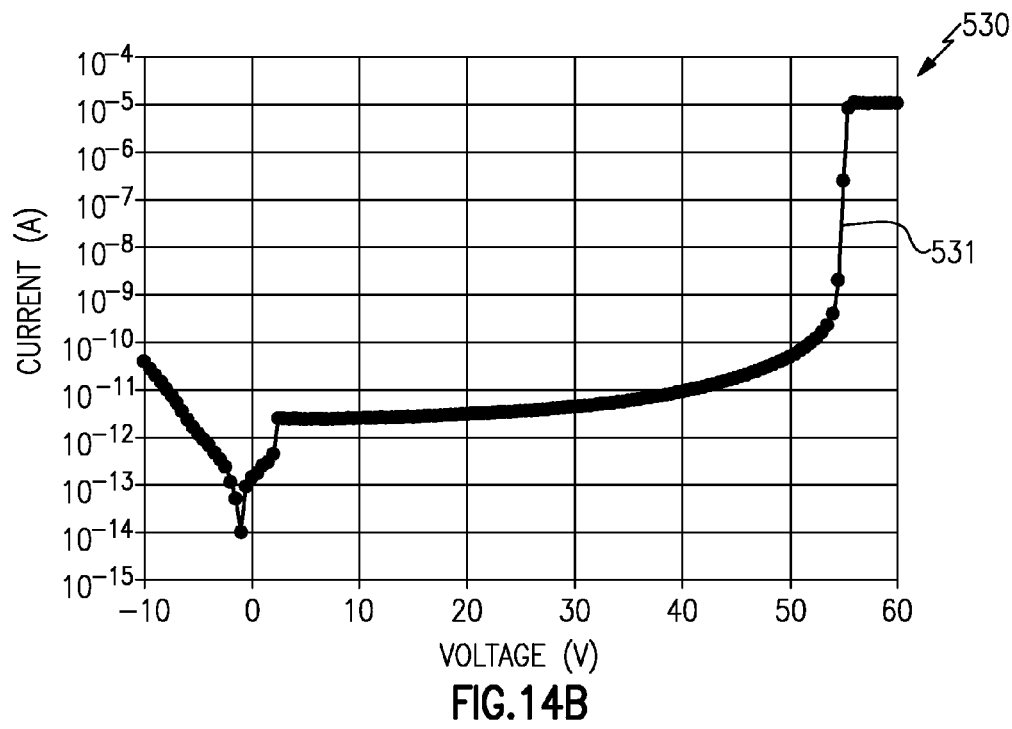

FIGS. 14A-14B are graphs of laboratory data showing substrate breakdown characteristics according to one embodiment. The measurement data corresponds to one implementation of the clamp device 130 of FIG. 5C. The measurements were taken at about 25° C.

FIG. 14A is a graph 520 of TLP laboratory data for a transient electrical event applied between the clamp device's first terminal VH and the clamp device's substrate terminal. The graph 520 includes a first plot 521 for TLP voltage versus TLP current.

As shown in FIG. 14A, the clamp device can have a substrate breakdown voltage between the first terminal VH and the substrate that is about 57 V. Thus, the clamp device can be highly isolated from voltage changes to the substrate terminal.

FIG. 14B is a graph 530 of TLP laboratory data for a transient electrical event applied between the clamp device's second terminal VL and the clamp device's substrate terminal. The graph 530 includes a first plot 531 for TLP voltage versus TLP current.

As shown in FIG. 14B, the clamp device can have a substrate breakdown voltage between the second terminal VL and the substrate that is about 55 V.

Figure 15:
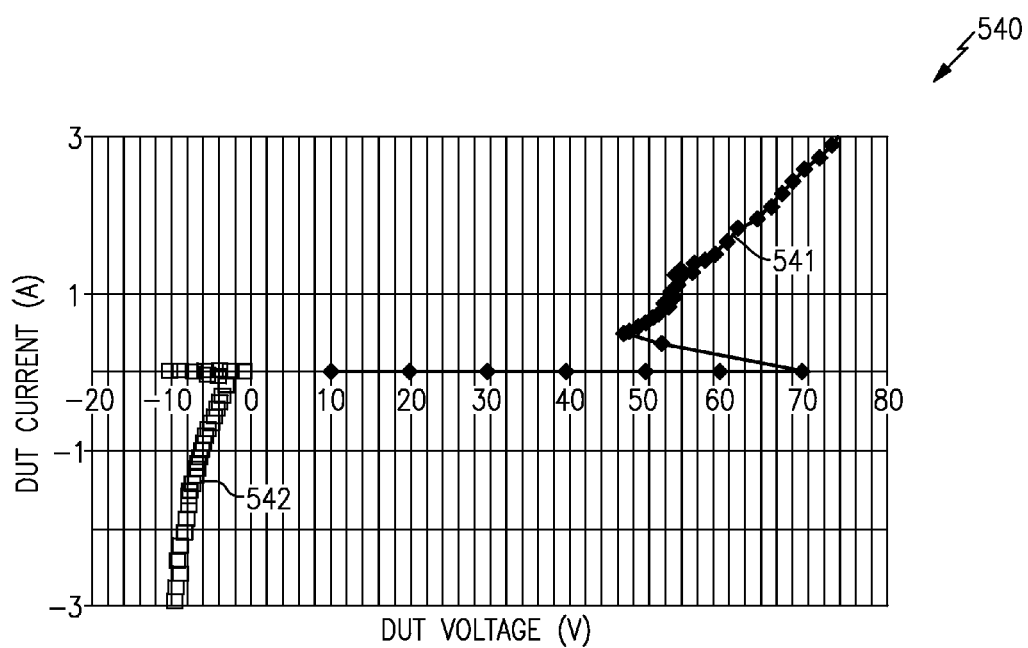
FIG. 15 is a graph of laboratory data showing forward and reverse dual-polarity overvoltage clamp characteristics according to another embodiment.

FIG. 15 is a graph 540 of laboratory data showing forward and reverse protection characteristics according to another embodiment. The measurement data corresponds to one implementation of the clamp device 300 of FIGS. 10A-10B. Although FIGS. 10A-10B illustrate laboratory data for one implementation of the clamp device 300, other results are possible, such as data associated with different manufacturing processes, device geometries, and/or doping concentrations.

The graph 540 includes a first plot 541 of TLP voltage versus TLP current for a positive transient electrical event and a second plot 542 of TLP voltage versus TLP current for a negative transient electrical event.

As shown in FIG. 15, the clamp device can have a forward trigger voltage of about 70 V, a forward holding voltage of about 46 V, a reverse trigger voltage of about −10 V, and a reverse holding voltage of about −2 V.

APPLICATIONS

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, an engine control unit, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
an n-type isolation structure in a p-type region of a substrate;
a first p-type well region in the n-type isolation structure;
a first p-type active region and a first n-type active region in the first p-type well region, wherein the first n-type active region and the first p-type active region are electrically connected to a first terminal;
a second p-type well region in the n-type isolation structure and spaced apart from the first p-type well region, wherein the n-type isolation structure electrically isolates the first and second p-type well regions from the p-type region of the substrate;
a second p-type active region and a second n-type active region in the second p-type well region, wherein the second n-type active region and the second p-type active region are electrically connected to a second terminal; and
a blocking voltage tuning structure positioned between the first and second n-type active regions.

2. The apparatus of claim 1, wherein the blocking voltage tuning structure comprises:
a first blocking junction comprising a first semiconductor interface between the first p-type well region and a first n-type region, wherein a reverse protection characteristic between the first and second terminals is based on a blocking voltage of the first blocking junction; and
a second blocking junction comprising a second semiconductor interface between the second p-type well region and a second n-type region, wherein a forward protection characteristic between the first and second terminals is based on a blocking voltage of the second blocking junction.

3. The apparatus of claim 1, wherein the n-type isolation structure comprises a first n-type well that comprises a first wall of the n-type isolation structure, a second n-type well that comprises a second wall of the n-type isolation structure, and a deep n-type well isolation region that comprises a bottom of the n-type isolation structure.

4. The apparatus of claim 1, wherein the blocking voltage tuning structure comprises:
a third n-type active region, wherein at least a portion of the third n-type active region is in the first p-type well region; and
a third p-type active region, wherein at least a portion of the third p-type active region is in the second p-type well region.

5. The apparatus of claim 4, wherein the blocking voltage tuning structure further comprises:
an n-type well abutting the first p-type well region, wherein the third n-type active region is positioned along a boundary between the first p-type well region and the n-type well.

6. The apparatus of claim 4, wherein the blocking voltage tuning structure further comprises:
an n-type lightly doped drain (NLDD) region beneath the third n-type active region.

7. The apparatus of claim 4, wherein the blocking voltage tuning structure further comprises:
an oxide region extending between the third n-type active region and the third p-type active region.

8. The apparatus of claim 4, wherein the blocking voltage tuning structure further comprises:
a dielectric region over a portion of the substrate between the third p-type active region and the third n-type active region; and
a conductor over the dielectric region.

9. The apparatus of claim 4, wherein the blocking voltage tuning structure further comprises:
a fourth p-type active region positioned between the third p-type active region and the third n-type active region.

10. The apparatus of claim 4, wherein the blocking voltage tuning structure further comprises:
a first oxide region adjacent to the third n-type active region; and
a second oxide region adjacent to the third p-type active region, wherein the first oxide region is spaced apart from the second oxide region.

11. The apparatus of claim 1, wherein the first p-type well region comprises at least one of a first p-type well or a first shallow p-type well, and wherein the second p-type well region comprises at least one of a second p-type well or a second shallow p-type well.

12. The apparatus of claim 1, wherein the blocking voltage tuning structure comprises:
a third p-type active region, wherein at least a portion of the third p-type active region is in the first p-type well region; and
a fourth p-type active region, wherein at least a portion of the fourth p-type active region is in the second p-type well region.

13. The apparatus of claim 12, wherein the blocking voltage tuning structure further comprises:
a first dielectric region over a portion of the substrate between the third p-type active region and the fourth p-type active region; and
a first conductor over the first dielectric region.

14. The apparatus of claim 12, wherein the blocking voltage tuning structure further comprises:
an n-type well positioned between the first p-type well region and the second p-type well region.

15. The apparatus of claim 12, wherein the blocking voltage tuning structure further comprises:
a p-type lightly doped drain (PLDD) region beneath the third p-type active region.

16. The apparatus of claim 12, wherein the blocking voltage tuning structure further comprises:
an oxide region positioned between the third p-type active region and the fourth p-type active region.

17. The apparatus of claim 12, wherein the blocking voltage tuning structure further comprises:
a third n-active region positioned between the third p-type active region and the fourth p-type active region.

18. The apparatus of claim 17, wherein the blocking voltage tuning structure further comprises:
a first dielectric region over a portion of the substrate between the third p-type active region and the third n-active region;
a first conductor over the first dielectric region;
a second dielectric region over a portion of the substrate between the fourth p-type active region and the third n-type active region; and
a second conductor over the second dielectric region.

19. The apparatus of claim 1, wherein the blocking voltage tuning structure comprises:
an n-type well positioned between the first p-type well region and the second p-type well region.

20. The apparatus of claim 19,
wherein the first p-type well region comprises a first shallow p-type well abutting the n-type well on a first side; and
wherein the second p-type well region comprises a second shallow p-type well abutting the n-type well on a second side.

21. The apparatus of claim 20,
wherein the first p-type well region further comprises a first p-type well offset from the first shallow p-type well, wherein the first p-type well is spaced apart from the n-type well, and
wherein the second p-type well region further comprises a second p-type well offset from the second shallow p-type well, wherein the second p-type well is spaced apart from the n-type well.

22. The apparatus of claim 20, wherein the blocking voltage tuning structure further comprises:
a first dielectric region over a boundary between the first shallow p-type well and the n-type well; and a first conductor over the first dielectric region;

a second dielectric region over a boundary between the second shallow p-type well and the n-type well; and a second conductor over the second dielectric region.

23. The apparatus of claim 22, wherein the blocking voltage tuning structure further comprises:

at least one active region in the n-type well positioned between the first conductor and the second conductor.

24. The apparatus of claim 1, wherein the n-type isolation structure comprises a first high voltage n-type well (HVNW) that operates as a first wall of the n-type isolation structure, a second HVNW that operates as a second wall of the n-type isolation structure, and an n-type buried layer isolation region that operates as a bottom of the n-type isolation structure.

25. The apparatus of claim 1, wherein the blocking voltage tuning structure comprises:

a first blocking junction comprising a first semiconductor interface between the first p-type well region and a first n-type region;

a second blocking junction comprising a second semiconductor interface between the second p-type well region and a second n-type region, wherein a forward protection characteristic between the first and second terminals is based on a blocking voltage of the second blocking junction; and a PNPN silicon controlled rectifier (SCR) configured to bypass the first blocking junction, wherein a reverse protection characteristic between the first and second terminals is controlled by the PNPN SCR.

26. The apparatus of claim 1, wherein the first p-type well region comprises at least a first high voltage p-type well (HVPW), and wherein the second p-type well region comprises at least a second HVPW.

27. The apparatus of claim 26, wherein the blocking voltage tuning structure comprises:

a HVNW positioned between the first HVPW and the second HVPW;

a first n-type well positioned in the first HVPW;

a third p-type active region positioned in the first n-type well and electrically connected to the HVNW via metallization, wherein the third p-type active region, the first n-type well, the first p-type well region, and the first n-type active region operate as a PNPN silicon controlled rectifier.

28. The apparatus of claim 27, wherein the first p-type well region further comprises at least one of a first p-type well or a first shallow p-type well abutting the first n-type well.

29. The apparatus of claim 27, wherein the blocking voltage tuning structure further comprises:

a third n-type active region positioned in the first n-type well; and a fourth n-type active region in the HVNW, wherein the third p-type active region and the fourth n-type active region are electrically connected to one another via metallization.

30. The apparatus of claim 29, wherein the blocking voltage tuning structure further comprises:

a fifth n-type active region in the HVNW;

a dielectric region over the HVNW between the fourth n-type active region and the fifth n-type active region; and a conductor over the dielectric region.

31. The apparatus of claim 29, wherein the third p-type active region and the third n-type active region are electrically connected to one another via metallization.

32. The apparatus of claim 27, wherein the first p-type well region further comprises a first p-type well abutting the first n-type well, wherein the blocking voltage tuning structure further comprises:

a dielectric region over a boundary between the first p-type well and the first n-type well; and a conductor over the dielectric region.

33. The apparatus of claim 27, wherein the blocking voltage tuning structure comprises:

a third n-type active region positioned in the first n-type well; and a fourth n-type active region in the HVNW, wherein the third p-type active region and the fourth n-type active region are electrically connected to one another via metallization.

34. The apparatus of claim 1, further comprising a p-type guard ring surrounding a plurality of sides of the n-type isolation structure, wherein the p-type guard ring does not abut the n-type isolation structure.

35. An apparatus comprising:

an n-type isolation structure in a p-type region of a substrate;

a first p-type well region in the n-type isolation structure;

a first p-type active region and a first n-type active region in the first p-type well region, wherein the first n-type active region and the first p-type active region are electrically connected to a first terminal;

a second p-type well region in the n-type isolation structure and spaced apart from the first p-type well region, wherein the n-type isolation structure electrically isolates the first and second p-type well regions from the p-type region of the substrate;

a second p-type active region and a second n-type active region in the second p-type well region, wherein the second n-type active region and the second p-type active region are electrically connected to a second terminal; and a means for blocking voltage tuning positioned between the first and second n-type active regions.

* * * * *